US012703912B2

(12) United States Patent
Sakurai et al.

(10) Patent No.: US 12,703,912 B2
(45) Date of Patent: Aug. 11, 2026

(54) THIN-FILM FORMING RAW MATERIAL, WHICH IS USED IN ATOMIC LAYER DEPOSITION METHOD, THIN-FILM, METHOD OF PRODUCING THIN-FILM, AND ZINC COMPOUND

(71) Applicant: ADEKA CORPORATION, Tokyo (JP)

(72) Inventors: Atsushi Sakurai, Tokyo (JP); Yoshiki Ooe, Tokyo (JP); Keisuke Takeda, Tokyo (JP); Chiaki Mitsui, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 98 days.

(21) Appl. No.: 18/280,559

(22) PCT Filed: Feb. 24, 2022

(86) PCT No.: PCT/JP2022/007559

§ 371 (c)(1), (2) Date: Sep. 6, 2023

(87) PCT Pub. No.: WO2022/190877

PCT Pub. Date: Sep. 15, 2022

(65) Prior Publication Data

US 2024/0167154 A1 May 23, 2024

(30) Foreign Application Priority Data

Mar. 8, 2021 (JP) ................................ 2021-036008

(51) Int. Cl.
*C23C 16/455* (2006.01)

(52) U.S. Cl.
CPC .. *C23C 16/45553* (2013.01); *C23C 16/45527* (2013.01)

(58) Field of Classification Search
CPC .................... C23C 16/45553; C23C 16/45527
See application file for complete search history.

(56) References Cited

U.S. PATENT DOCUMENTS 4,880,492 A 11/1989 Erdmann et al.
5,099,044 A * 3/1992 Erdmann ................. C07F 5/00 556/1

(Continued)

FOREIGN PATENT DOCUMENTS

JP 3-173140 A 11/1987
JP 63-83092 A 4/1988

(Continued)

OTHER PUBLICATIONS

International Search Report issued Apr. 26, 2022 in International Bureau of WIPO Patent Application No. PCT/JP2022/007559 with an English translation thereof.
Written Opinion issued Apr. 26, 2022 in International Bureau of WIPO Patent Application No. PCT/JP2022/007559 with an English translation thereof.

(Continued)

*Primary Examiner* — Kelly M Gambetta
(74) *Attorney, Agent, or Firm* — Greenblum & Bernstein, P.L.C.

(57) ABSTRACT

Provided is a thin-film forming raw material, which is used in an atomic layer deposition method, including a compound represented by the following general formula (1):

$$M(R^1)_{x1}[A^1\text{-}N(R^2)(R^3)]_{y1} \quad (1)$$

in the formula (1), $R^1$, $R^2$, and $R^3$ each independently represent a linear or branched alkyl group having 1 to 4 carbon atoms, $A^1$ represents a linear or branched alkylene group having 1 to 5 carbon atoms, x1 represents an integer of from 0 to 2, y1 represents an integer of from 1 to 3, and M represents an indium atom or a zinc atom, provided that when M represents an indium atom, a compound in which x1 represents 2, y1 represents 1, and $R^1$, $R^2$, and $R^3$ each represent a methyl group is excluded.

3 Claims, 4 Drawing Sheets

(56) References Cited

U.S. PATENT DOCUMENTS

| | | | | |
|---|---|---|---|---|
| 5,112,432 | A | 5/1992 | Erdmann et al. | |
| 5,149,853 | A | 9/1992 | Erdmann et al. | |
| 7,732,013 | B2 * | 6/2010 | Stricker | C03C 17/245 427/166 |
| 2006/0240662 | A1 | 10/2006 | Conley et al. | |
| 2009/0321733 | A1 * | 12/2009 | Gatineau | C01G 25/02 438/758 |
| 2014/0210835 | A1 * | 7/2014 | Hong | H10D 84/038 345/530 |
| 2016/0207941 | A1 | 7/2016 | Sundermeyer et al. | |
| 2016/0207942 | A1 | 7/2016 | Sundermeyer et al. | |
| 2017/0183361 | A1 | 6/2017 | Sundermeyer et al. | |
| 2019/0194229 | A1 | 6/2019 | Sundermeyer et al. | |
| 2021/0340162 | A1 * | 11/2021 | Okada | C07F 5/00 |

FOREIGN PATENT DOCUMENTS

| | | | | |
|---|---|---|---|---|
| JP | 2006-310808 | A | 11/2006 | |
| JP | 2016-511936 | A | 4/2016 | |
| JP | 2016-536325 | A | 11/2016 | |
| KR | 10-1995-0001217 | B1 | 2/1995 | |
| KR | 10-2016-0045787 | A | 4/2016 | |
| KR | 10-2020-0054851 | | 5/2020 | |
| NL | 8601042 | A | 11/1987 | |
| WO | 2014/116500 | A1 | 7/2014 | |
| WO | 2015/024894 | A1 | 2/2015 | |
| WO | WO-2020071175 | A1 * | 4/2020 | C23C 16/45553 |

OTHER PUBLICATIONS

Paul O'Brien et.al., "Vapour-pressure Data for Adducts of Dimethylzinc: Sources and Dopants for Zinc in Metal-Organic Chemical Vapour Deposition", Journal of Materials Chemistry, 1993.07, vol. 3, No. 7, pp. 739-742.

David Zanders et al., "Cobalt Metal ALD: Understanding the Mechanism and Role of Zinc Alkyl Precursors as Reductants for Low-Resistivity Co Thin Films", Chemistry of Materials, Jun. 18, 2021, vol. 33,pp. 5045-5057.

Office Action dated Mar. 17, 2025, in Taiwanese family member application No. 1 1 4 2 0 2 8 1 9 2 0. Note: Although portions are not in the English language, many portions (see, e.g., pp. 7, 14 and 16) are in English and include the Examiner's categorization of the cited documents (e.g., "X", "Y", "A", etc.) and the US Examiner's consideration is respectfully requested on at least this basis.

Mai, et al., "From Precursor Chemistry to Gas Sensors: Plasma-Enhanced Atomic Layer Deposition Process Engineering for Zinc Oxide Layers from a Nonpyrophoric Zinc Precursor for Gas Barrier and Sensor Applications". Small.16, 22. Wiley-VCH.Apr. 28, 2020. 1907506.

Pohl, et al., "Physical properties of non-pyrophoric group III precursors for MOVPE". Journal of Crystal Growth.107, 1-4. Elsevier. Jan. 1, 1991.309-313.

Office Action that issued on Feb. 3, 2026, in corresponding Japanese Application No. 2023-505280, along with English translation thereof.

Office Action that issued on May 7, 2026, in corresponding Korean Application No. 10-2023-7033692, along with English translation thereof.

* cited by examiner

THIN-FILM FORMING RAW MATERIAL, WHICH IS USED IN ATOMIC LAYER DEPOSITION METHOD, THIN-FILM, METHOD OF PRODUCING THIN-FILM, AND ZINC COMPOUND

TECHNICAL FIELD

The present invention relates to a thin-film forming raw material, which is used in an atomic layer deposition method, including an indium compound or a zinc compound having a specific structure, a thin-film obtained by using the thin-film forming raw material, which is used in an atomic layer deposition method, a method of producing a thin-film through use of the thin-film forming raw material, which is used in an atomic layer deposition method, and a zinc compound.

BACKGROUND ART

The term "semiconductor" as used herein represents general semiconductors each capable of functioning through utilization of semiconductor characteristics. Examples thereof include semiconductors to be used in a semiconductor circuit, an arithmetic device, a storage device, an image pickup device, a display device, a liquid crystal display device, a light emitting device, a power generation device, such as a thin-film solar electricity or an organic thin-film solar cell, and an electronic device as well as in a semiconductor element such as a transistor.

Indium and zinc are each used as a constituent component of a compound semiconductor, and as a thin-film forming raw material for producing a thin-film containing indium or zinc, various compounds have been reported.

As a method of producing a thin-film, there are given, for example, a sputtering method, an ion plating method, metal organic decomposition (MOD) methods, such as a coating thermal decomposition method and a sol-gel method, and vapor thin-film formation methods, such as a chemical vapor deposition (CVD) method and an atomic layer deposition (ALD) method. Of those, an ALD method is an optimum production process because the method has such many advantages as described below. The method is excellent in composition controllability and step coverage, is suitable for mass production, and enables hybrid integration.

Various thin-film forming raw materials that can be used in vapor thin-film formation methods, such as the CVD method and the ALD method, have been reported. However, in a thin-film forming raw material applicable to the ALD method, it is required that a temperature region called an ALD window be sufficiently wide. It is common general technical knowledge in the art that even a thin-film forming raw material, which can be used in the CVD method, is not suitable for the ALD method in many cases.

For example, as a method of producing a thin-film containing a metal, in Patent Document 1, there is disclosed a method of producing a thin-film by an ALD method using a thin-film precursor containing indium as a transistor thin-film material for achieving a high-definition display.

In Patent Document 2, trimethylindium is given as an example of a precursor containing indium for forming a layer of indium oxide ($In_2O_3$) by an ALD method.

In Patent Document 3, there is disclosed a method of forming a thin-film of zinc oxide by an ALD method using diethylzinc.

CITATION LIST

Patent Document

Patent Document 1: KR 10-2020-0054851 A
Patent Document 2: JP 2016-511936 A
Patent Document 3: JP 2006-310808 A

SUMMARY OF INVENTION

Technical Problem

The ALD method is a method of stacking atomic layers one by one on a substrate set in a vacuum container by repetitively performing: a step of causing a molecule of a raw material compound to adsorb to the surface of the substrate or the surface of a film; a film formation step based on a reaction between the molecule having adsorbed to the surface of the substrate or the surface of the film and a reactive gas; and a step of removing the redundant molecule through purging. Thus, the ALD method enables control of the atomic layers at a single layer level, and a film having high homogeneity and high step coverage can be formed. However, the ALD method has difficulty in performing film formation at high temperature as compared to the CVD method, and has a problem in that carbon is liable to remain in the film.

In Patent Document 1, there is described that [(3-dimethylamino)propyl]dimethylindium is used as a material for an ALD method or a material for a CVD method, which is a liquid at normal temperature and can suppress spontaneous combustibility. However, when a film is formed through use of [(3-dimethylamino)propyl]dimethylindium at a temperature of from 300° C. to 400° C., there has been a problem in that a thin-film shrinks to be broken at the time of cooling. Meanwhile, when a film is formed at a temperature of from 200° C. to 250° C., a thin-film has not been successfully grown in some cases.

The ALD method using trimethylindium given as an example in Patent Document 2 has had a problem in that carbon is liable to remain in a film.

In addition, the ALD method using diethylzinc disclosed in Patent Document 3 has had a problem in that carbon is liable to remain in a film.

Accordingly, an object of the present invention is to provide a thin-film forming raw material, which is used in an atomic layer deposition method, capable of producing a thin-film containing an indium atom (hereinafter sometimes referred to as "indium-containing thin-film") or a thin-film containing a zinc atom (hereinafter sometimes referred to as "zinc-containing thin-film"), which has a small residual carbon amount and high quality, through use of an ALD method, a thin-film obtained by using the thin-film forming raw material, which is used in an atomic layer deposition method, and a method of producing the thin-film.

Solution to Problem

The inventors of the present invention have made extensive investigations, and have found that the above-mentioned problems can solved by a thin-film forming raw material, which is used in an atomic layer deposition method, including an indium compound or a zinc compound having a specific structure, to achieve the present invention.

That is, the present invention is a thin-film forming raw material, which is used in an atomic layer deposition method, including a compound represented by the following general formula (1):

$$M(R^1)_{x1}[A^1\text{-}N(R^2)(R^3)]_{y1} \quad (1)$$

In the formula (1), $R^1$, $R^2$, and $R^3$ each independently represent a linear or branched alkyl group having 1 to 4 carbon atoms, $A^1$ represents a linear or branched alkylene group having 1 to 5 carbon atoms, x1 represents an integer of from 0 to 2, y1 represents an integer of from 1 to 3, and M represents an indium atom or a zinc atom, provided that a compound in which M represents an indium atom, x1 represents 2, y1 represents 1, and $R^1$, $R^2$, and $R^3$ each represent a methyl group is excluded.

The present invention is a thin-film, which is obtained by using the thin-film forming raw material, which is used in an atomic layer deposition method.

The present invention is a method of producing a thin-film containing an indium atom or a thin-film containing a zinc atom on a surface of a substrate by an atomic layer deposition method, the method including: a step 1 of causing a raw material gas, which is obtained by vaporizing the thin-film forming raw material, which is used in an atomic layer deposition method, to adsorb to the surface of the substrate, to thereby form a precursor thin-film; a step 2 of evacuating the raw material gas remaining unreacted; and a step 3 of causing the precursor thin-film to react with a reactive gas, to thereby form the thin-film containing an indium atom or the thin-film containing a zinc atom on the surface of the substrate.

In the method of producing a thin-film of the present invention, it is preferred that the reactive gas be an oxidizing gas, and the thin-film containing an indium atom be indium oxide, or the thin-film containing a zinc atom be zinc oxide.

In the method of producing a thin-film of the present invention, the oxidizing gas is preferably a gas containing at least one selected from the group consisting of: oxygen; ozone; and water vapor.

In addition, the present invention is a zinc compound represented by the following general formula (2):

$$Zn(R^4)[A^2\text{-}N(R^5)(R^6)] \quad (2)$$

In the formula (2), $R^4$ represents a methyl group or an ethyl group, $R^5$ and $R^6$ each independently represent a linear or branched alkyl group having 2 to 4 carbon atoms, and $A^2$ represents a linear or branched alkylene group having 1 to 4 carbon atoms.

Advantageous Effects of Invention

According to the present invention, the thin-film containing an indium atom or the thin-film containing a zinc atom, which has a small residual carbon amount and high quality, can be produced through use of the ALD method.

DESCRIPTION OF EMBODIMENTS

Figure 1:
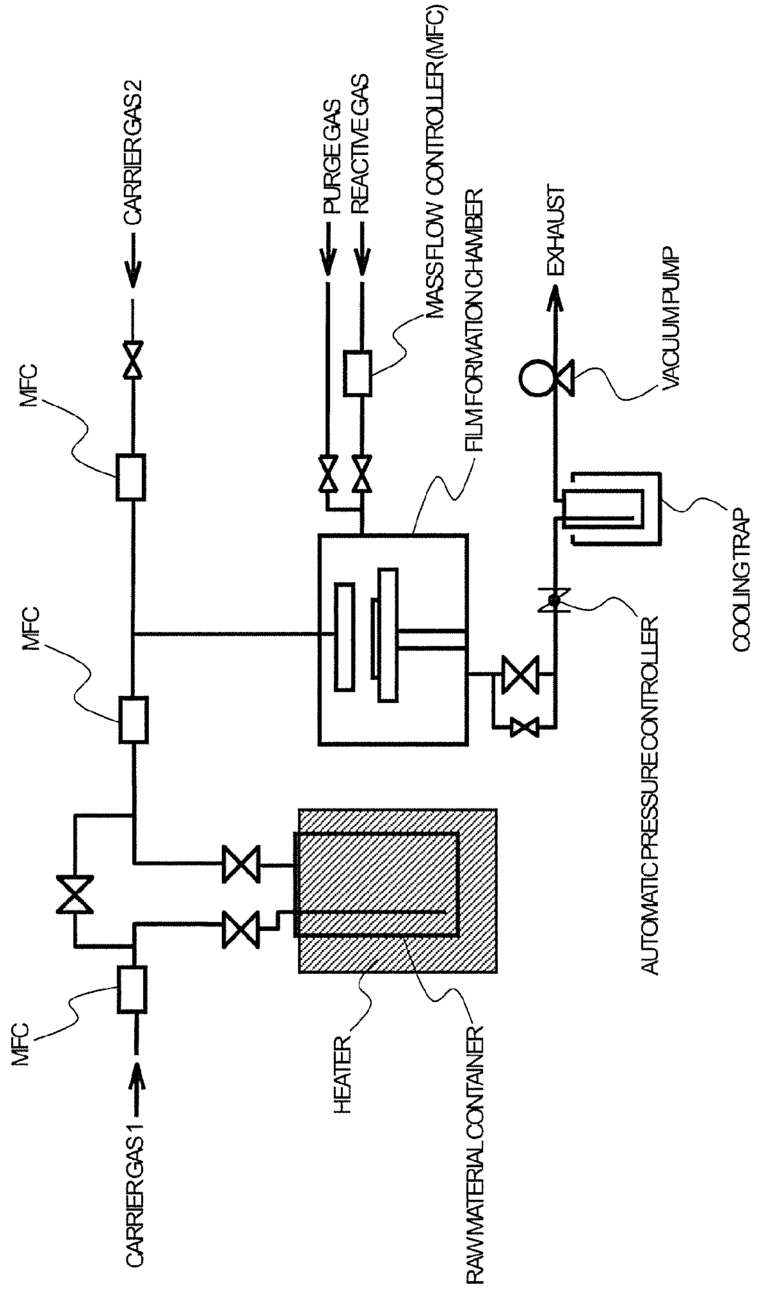
FIG. 1 is a schematic diagram for illustrating an example of an ALD apparatus to be used in a method of producing a thin-film of the present invention.

A thin-film forming raw material, which is used in an atomic layer deposition method, of the present invention includes a compound represented by the above-mentioned general formula (1).

Examples of the linear or branched alkyl group having 1 to 4 carbon atoms represented by each of $R^1$, $R^2$, and $R^3$ in the general formula (1) include a methyl group, an ethyl group, a n-propyl group, an isopropyl group, a n-butyl group, an isobutyl group, a sec-butyl group, and a tert-butyl group.

Examples of the alkylene group having 1 to 5 carbon atoms represented by $A^1$ in the general formula (1) include a methylene group, an ethylene group, a propylene group, a methylethylene group, a butylene group, a 1-methylpropylene group, a 2-methylpropylene group, a 1,2-dimethylpropylene group, a 1,3-dimethylpropylene group, a 1-methylbutylene group, a 2-methylbutylene group, a 3-methylbutylene group, and a 4-methylbutylene group.

It is preferred to combine $R^1$, $R^2$, $R^3$, and $A^1$ so that the compound represented by the general formula (1) is in a liquid state under normal temperature and normal pressure, and has a high vapor pressure. Specifically, a compound in which $R^1$, $R^2$, and $R^3$ each independently represent a methyl group or an ethyl group is preferred because such compound has a high vapor pressure. In addition, a compound in which $A^1$ represents an ethylene group, a propylene group, or a butylene group is preferred because such compound has satisfactory reactivity with an oxidizing gas, and a compound in which $A^1$ represents a propylene group is more preferred. A compound in which $R^1$, $R^2$, and $R^3$ each independently represent a methyl group or an ethyl group, and $A^1$ represents a propylene group is still more preferred because the production of a high-quality thin-film having a small residual carbon amount is facilitated. When x1 represents 2, a plurality of $R^1$s may be identical to or different from each other, but are preferably identical to each other from the viewpoint of easiness of synthesis of the compound. In addition, when y1 represents 2 or 3, a plurality of each of $A^1$s, $R^2$s, and $R^3$s may be identical to or different from each other, but are preferably identical to each other from the viewpoint of easiness of synthesis of the compound.

Preferred specific examples of the compound represented by the general formula (1) to be used in the thin-film forming raw material, which is used in an atomic layer deposition method, of the present invention include No. 1 to No. 423 below, but the present invention is not limited to these compounds. In Compounds No. 1 to No. 423 below, the symbol "Me" represents a methyl group, the symbol "Et" represents an ethyl group, the symbol "nPr" represents a n-propyl group, and the symbol "iPr" represents an isopropyl group.

No. 1

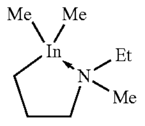

No. 2

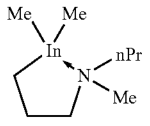

No. 3

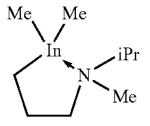

-continued
No. 4
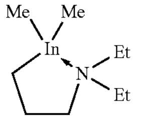
No. 5
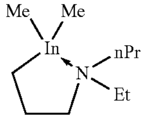
No. 6
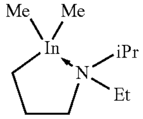
No. 7
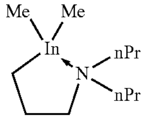
No. 8
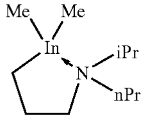
No. 9
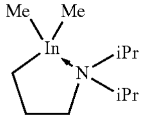
No. 10
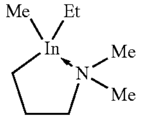
No. 11
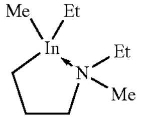
No. 12
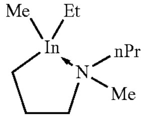
No. 13
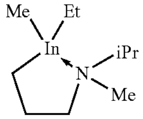
No. 14
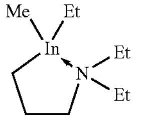
Nol. 15
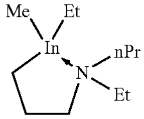
-continued
No. 16
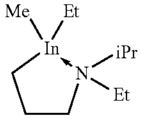
No. 17
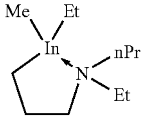
No. 18
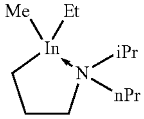
No. 19
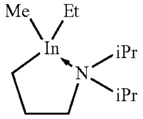
No. 20
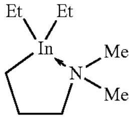
No. 21
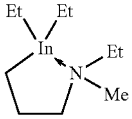
No. 22
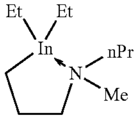
No. 23
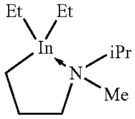
No. 24
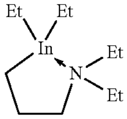
No. 25
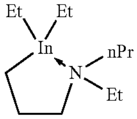
No. 26
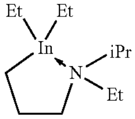
No. 27
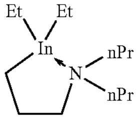

-continued
No. 28
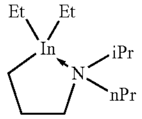
No. 29
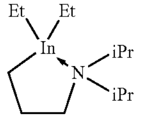
No. 30
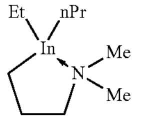
No. 31
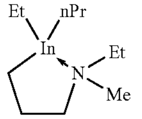
No. 32
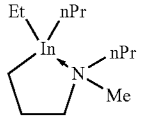
No. 33
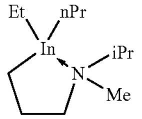
No. 34
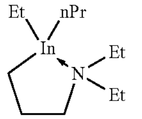
No. 35
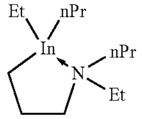
No. 36
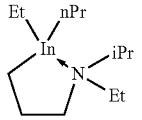
No. 37
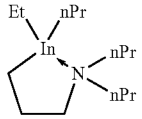
No. 38
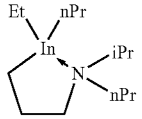
No. 39
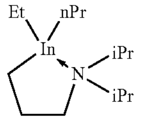
-continued
No. 40
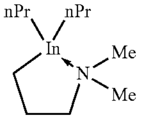
No. 41
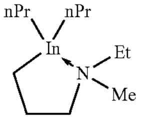
No. 42
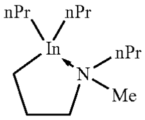
No. 43
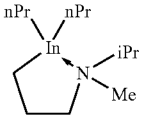
No. 44
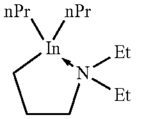
No. 45
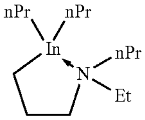
No.46
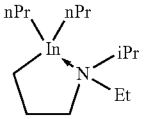
No. 47
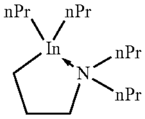
No.48
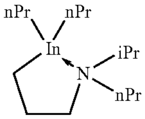
No. 49
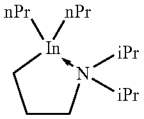
No. 50
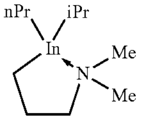
No. 51
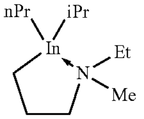

-continued
No. 52
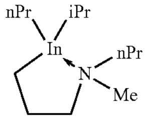
No. 53
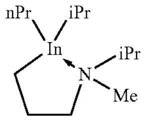
No. 54
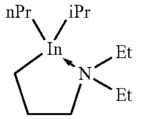
No. 55
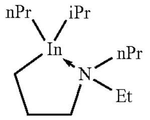
No. 56
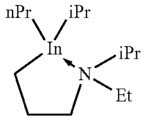
No. 57
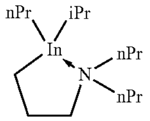
No. 58
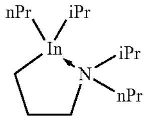
No. 59
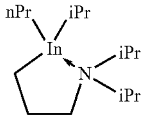
No. 60
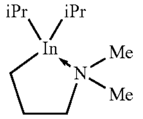
No. 61
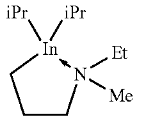
No. 62
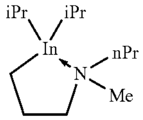
No. 63
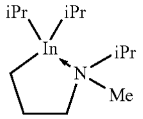
-continued
No. 64
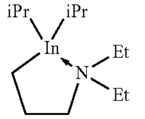
No. 65
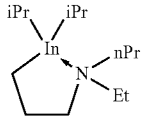
No. 66
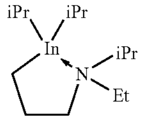
No. 67
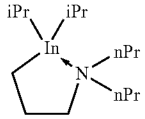
No. 68
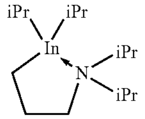
No. 69
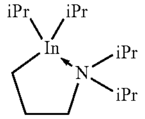
No. 70
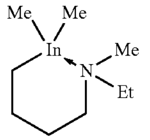
No. 71
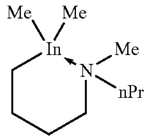
No. 72
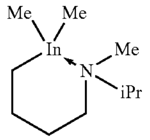
No. 73
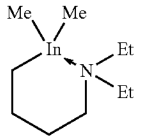
No. 74
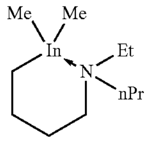

-continued
No. 75
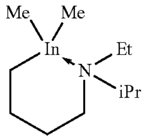
No. 76
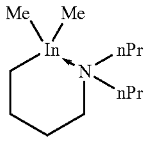
No. 77
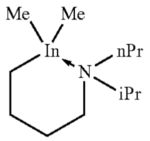
No. 78
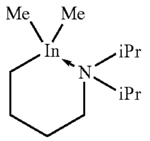
No. 79
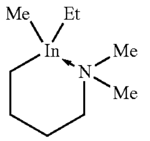
No. 80
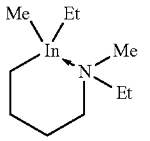
No. 81
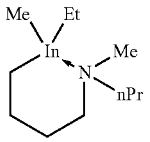
No. 82
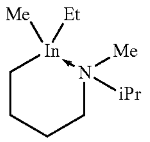
No. 83
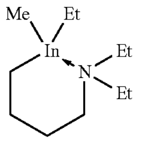
No. 84
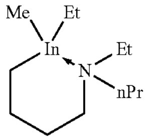
-continued
No. 85
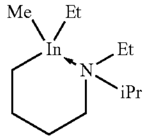
No. 86
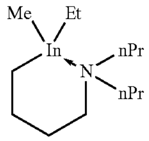
No. 87
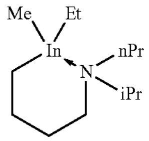
No. 88
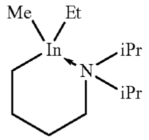
No. 89
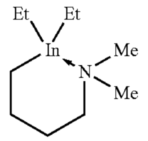
No. 90
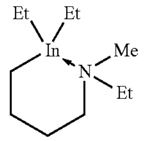
Nol. 91
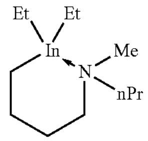
No. 92
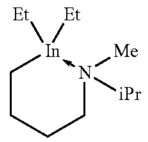
No. 93
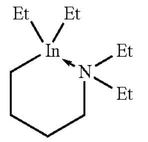
No. 94
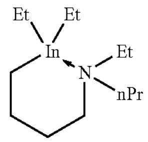

-continued
No. 95
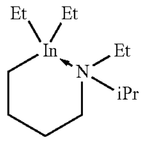
No. 96
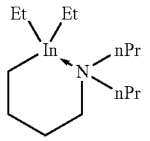
No. 97
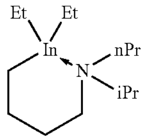
No. 98
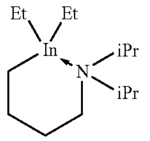
No. 99
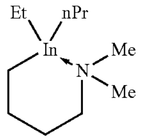
No. 100
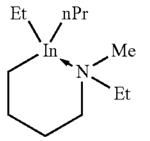
No. 101
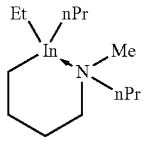
No. 102
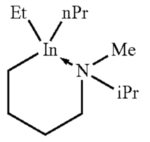
No. 103
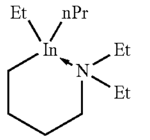
No. 104
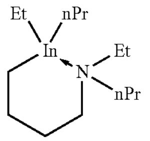
-continued
No. 105
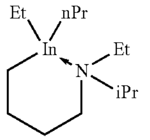
No. 106
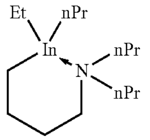
No. 107
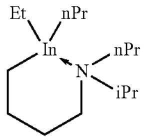
No. 108
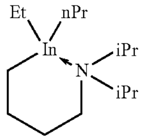
No. 109
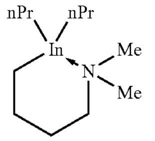
No. 110
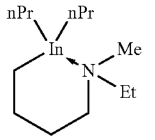
No. 111
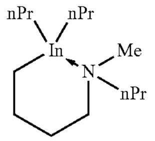
No. 112
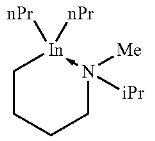
No. 113
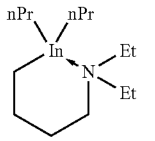
No. 114
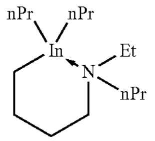

-continued
No. 115
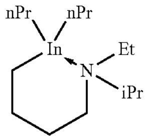
No. 116
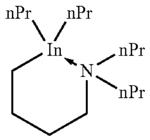
No. 117
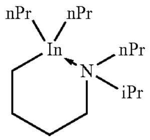
No. 118
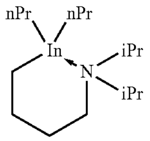
No. 119
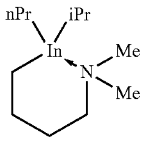
No. 120
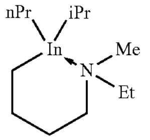
No. 121
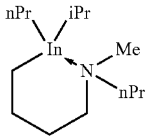
No. 122
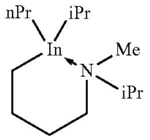
No. 123
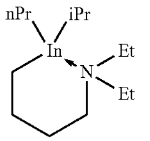
No. 124
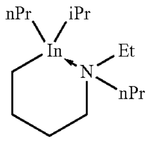
-continued
No. 125
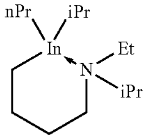
No.126
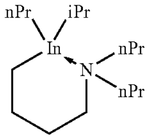
No. 127
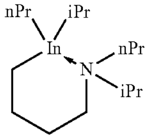
No. 128
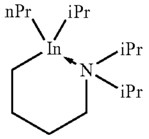
No. 129
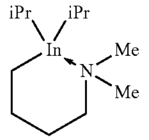
No. 130
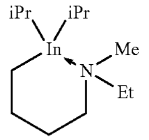
No. 131
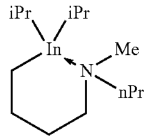
No. 132
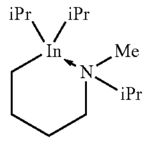
No. 133
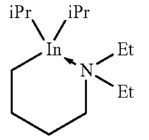
No. 134
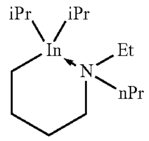

-continued
No. 135
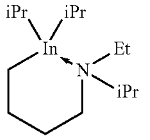
No. 136
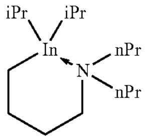
No. 137
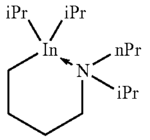
No. 138
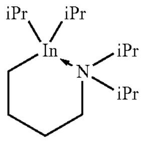
No. 139
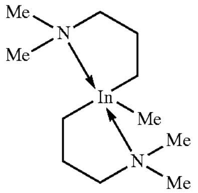
No. 140
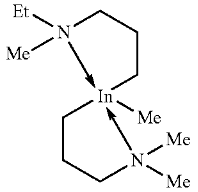
No. 141
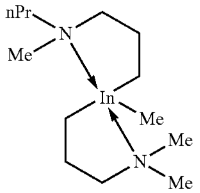
No. 142
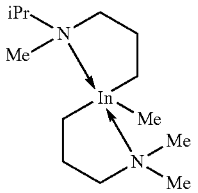
-continued
No. 143
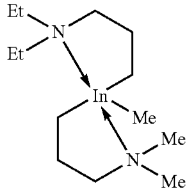
No. 144
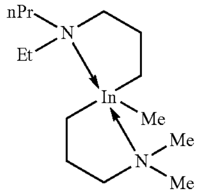
No. 145
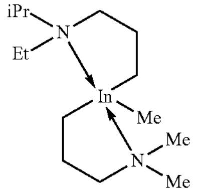
No. 146
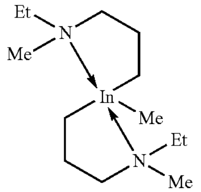
No. 147
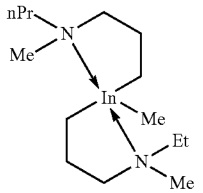
No. 148
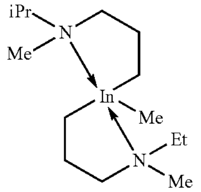
No. 149
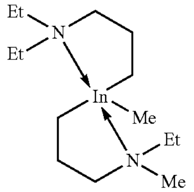
No. 150
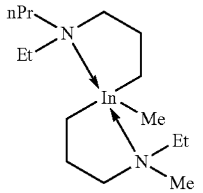

-continued
No. 151
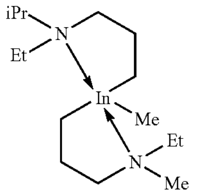
No. 152
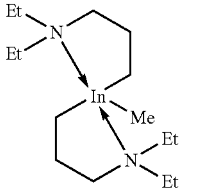
No. 153
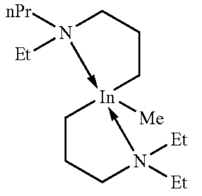
No. 154
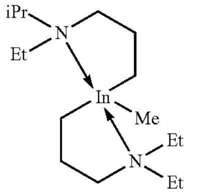
No. 155
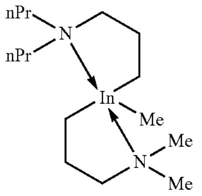
No. 156
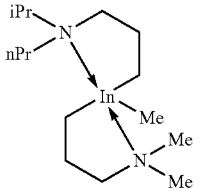
No. 157
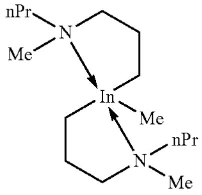
No. 158
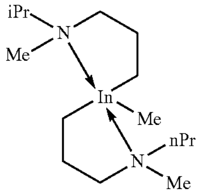
-continued
No. 159
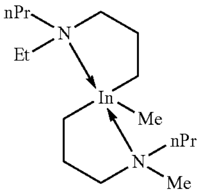
No. 160
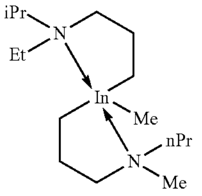
No. 161
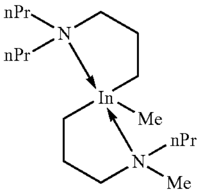
No. 162
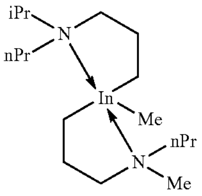
No. 163
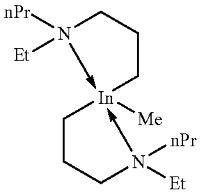
No. 164
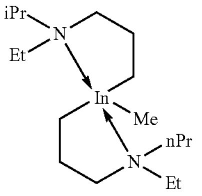
No. 165
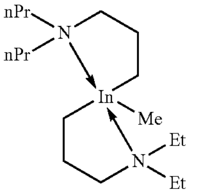
No. 166
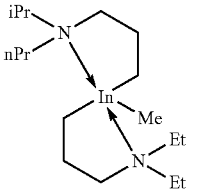

-continued
No. 167
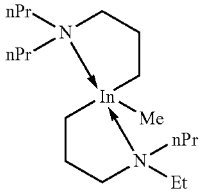
No. 168
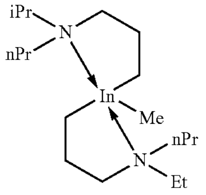
No. 169
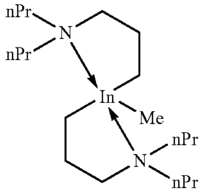
No. 170
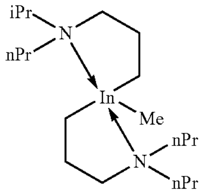
No. 171
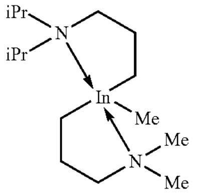
No. 172
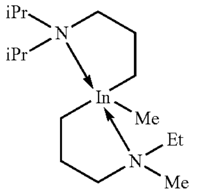
No. 173
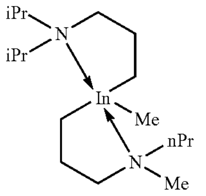
No. 174
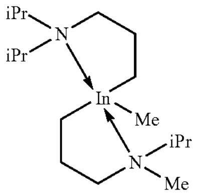
-continued
No. 175
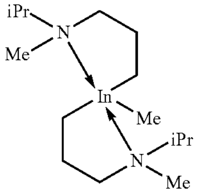
No. 176
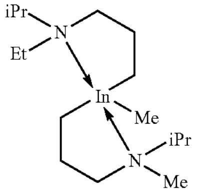
No. 177
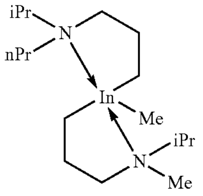
No. 178
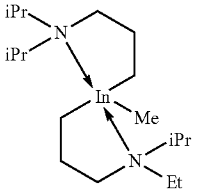
No. 179
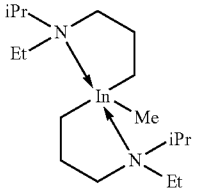
No. 180
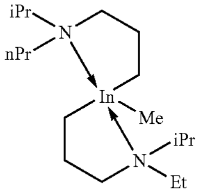
No. 181
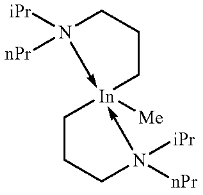
No. 182
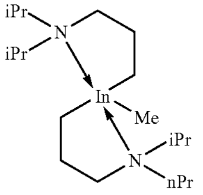

-continued
No. 183
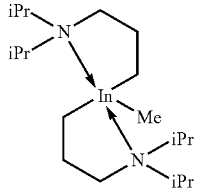
No. 184
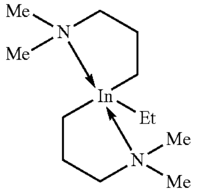
No. 185
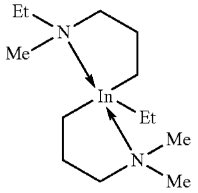
No. 186
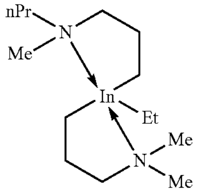
No. 187
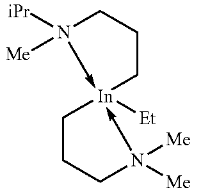
No. 188
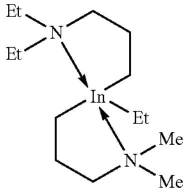
No. 189
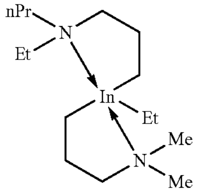
No. 190
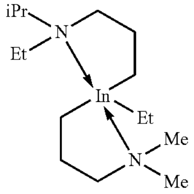
-continued
No. 191
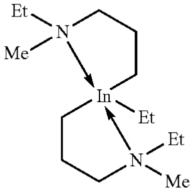
No. 192
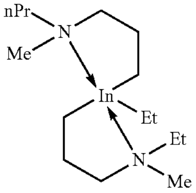
No. 193
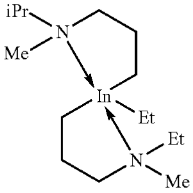
No. 194
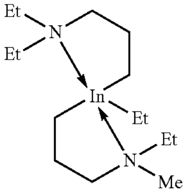
No. 195
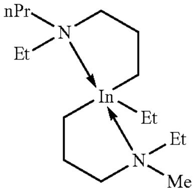
No. 196
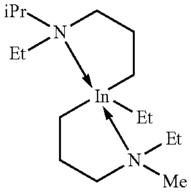
No. 197
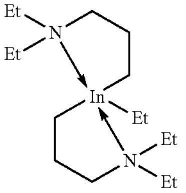
No. 198
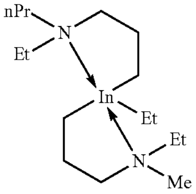

-continued
No. 199
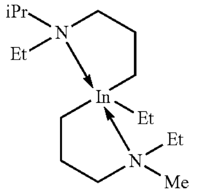
No. 200
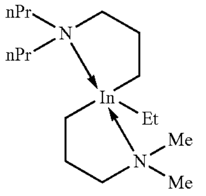
No. 201
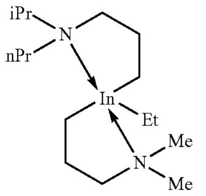
No. 202
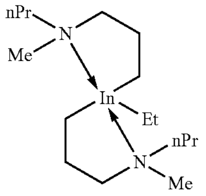
No. 203
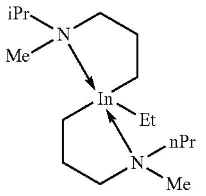
No. 204
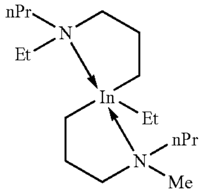
No. 205
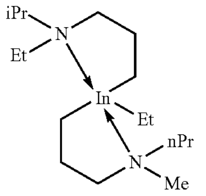
No. 206
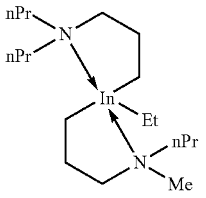
-continued
No. 207
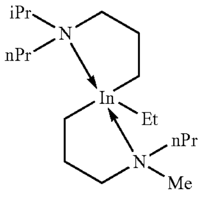
No. 208
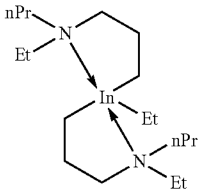
No. 209
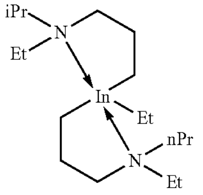
No. 210
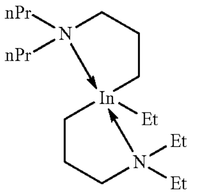
No. 211
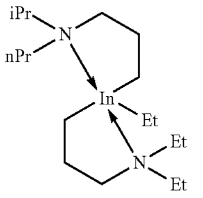
No. 212
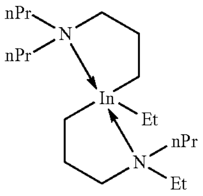
No. 213
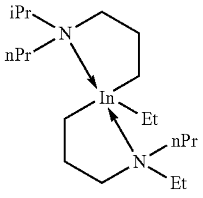
No. 214
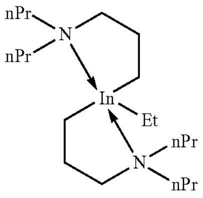

-continued
No. 215
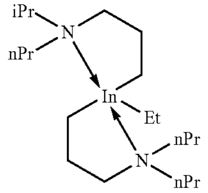
No. 216
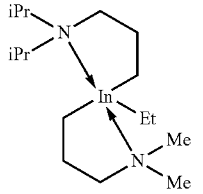
No. 217
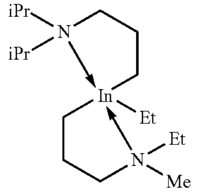
No. 218
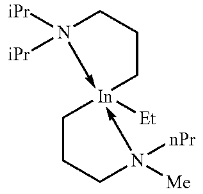
No. 219
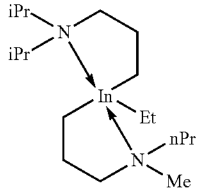
No. 220
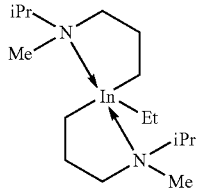
No. 221
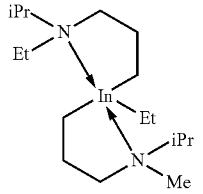
No. 222
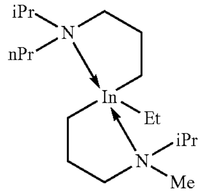
-continued
No. 223
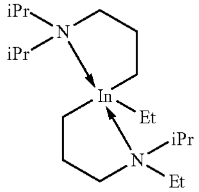
No. 224
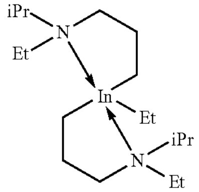
No. 225
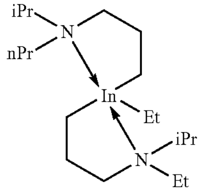
No. 226
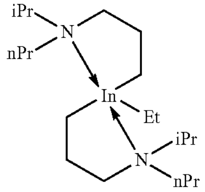
No. 227
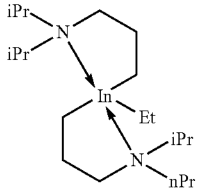
No. 228
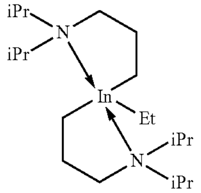
No. 229
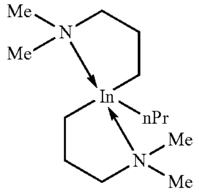
No. 230
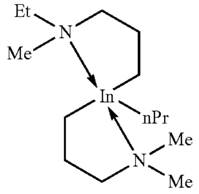

-continued
No. 231
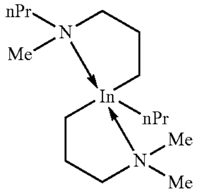
No. 232
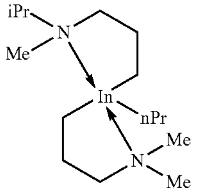
No. 233
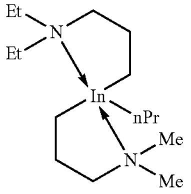
No. 234
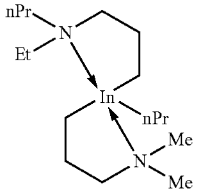
No. 235
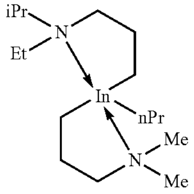
No. 236
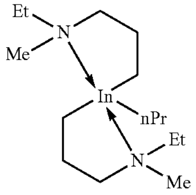
No. 237
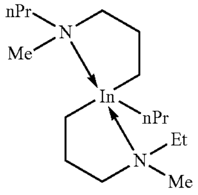
No. 238
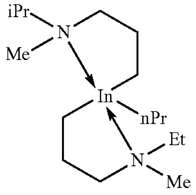
-continued
No. 239
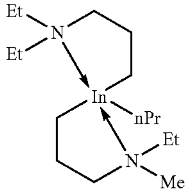
No. 240
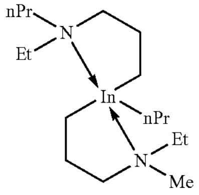
No. 241
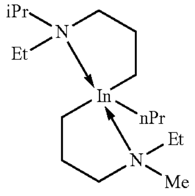
No. 242
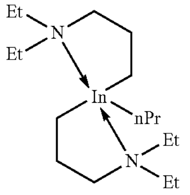
No. 243
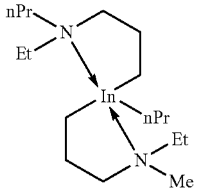
No. 244
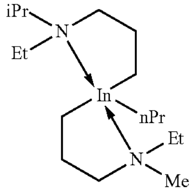
No. 245
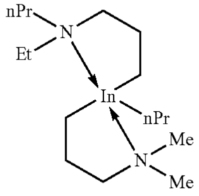
No. 246
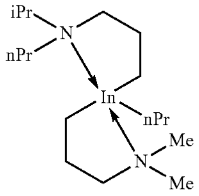

-continued
No. 247
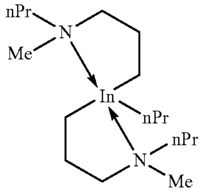
No. 248
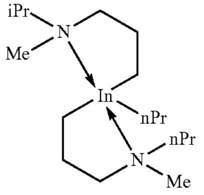
No. 249
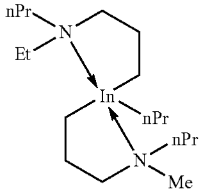
No. 250
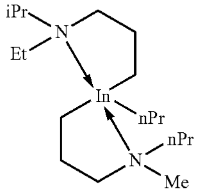
No. 251
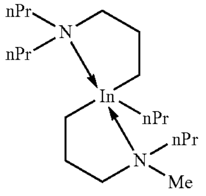
No. 252
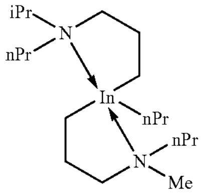
No. 253
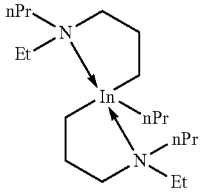
No. 254
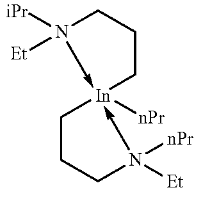
-continued
No. 255
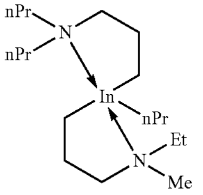
No. 256
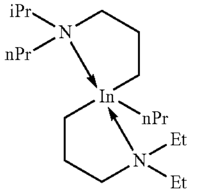
No. 257
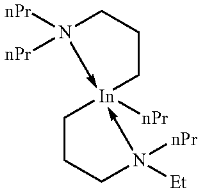
No. 258
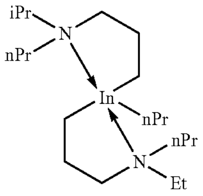
No. 259
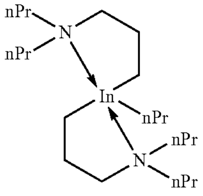
No. 260
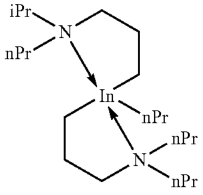
No. 261
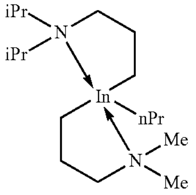
No. 262
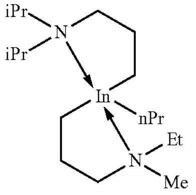

-continued
No. 263
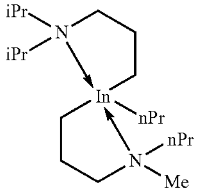
No. 264
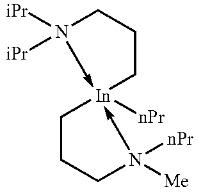
No. 265
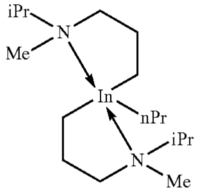
No. 266
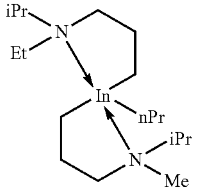
No. 267
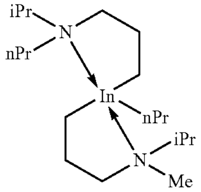
No. 268
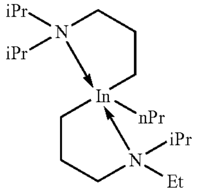
No. 269
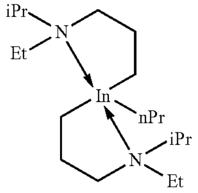
No. 270
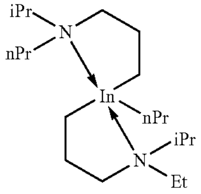
-continued
No. 271
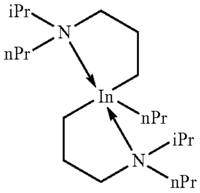
No. 272
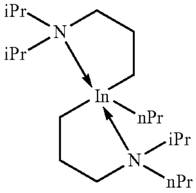
No. 273
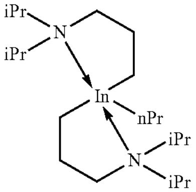
No. 274
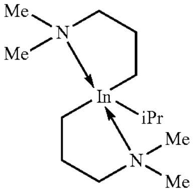
No. 275
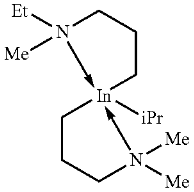
No. 276
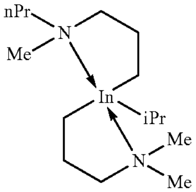
No. 277
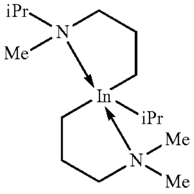
No. 278
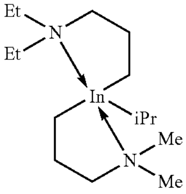

-continued
No. 279
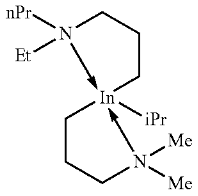
No. 280
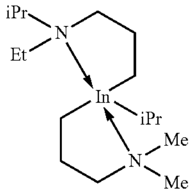
No. 281
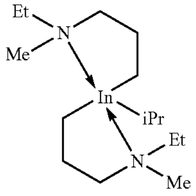
No. 282
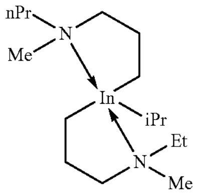
No. 283
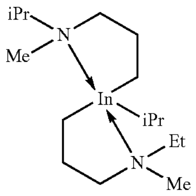
No. 284
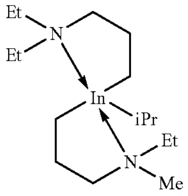
No. 285
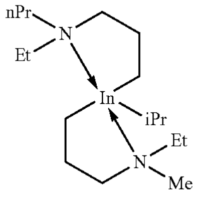
No. 286
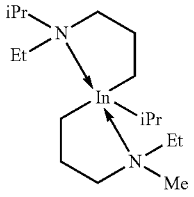
-continued
No. 287
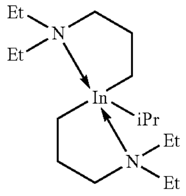
No. 288
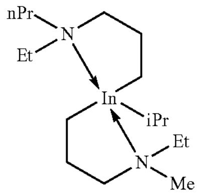
No. 289
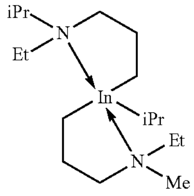
No. 290
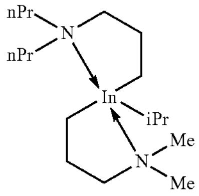
No. 291
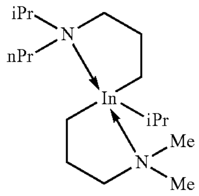
No. 292
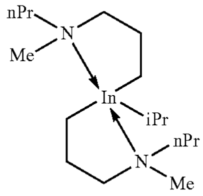
No. 293
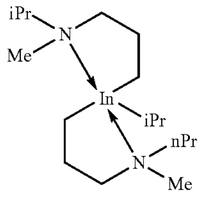
No. 294
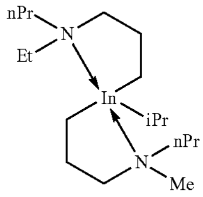

-continued
No. 295
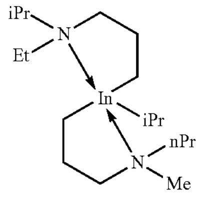
No. 296
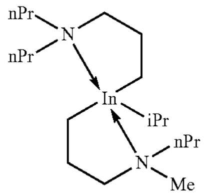
No. 297
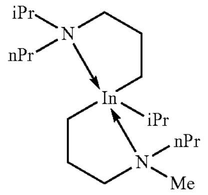
No. 298
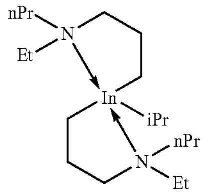
No. 299
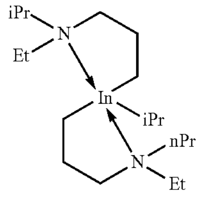
No. 300
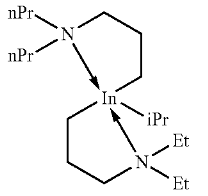
No. 301
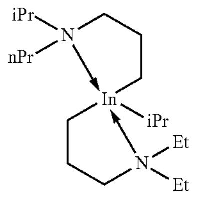
-continued
No. 302
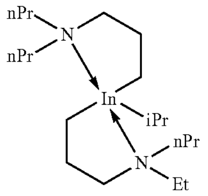
No. 303
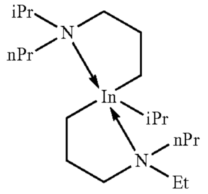
No. 304
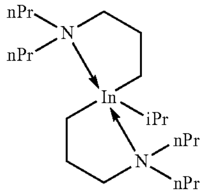
No. 305
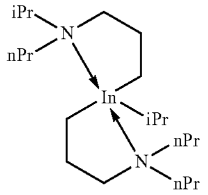
No. 306
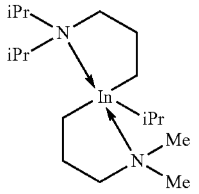
No. 307
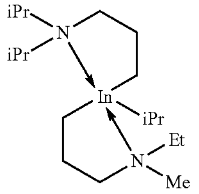
No. 308
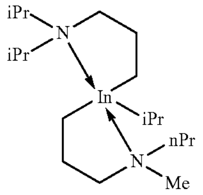
No. 309
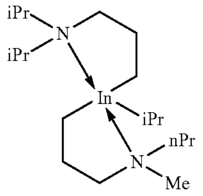

-continued
No. 310
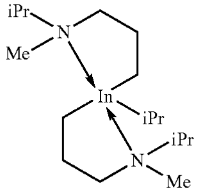
No. 311
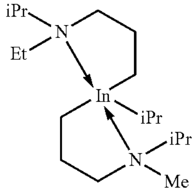
No. 312
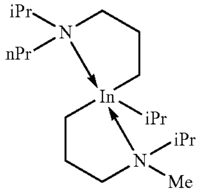
No. 313
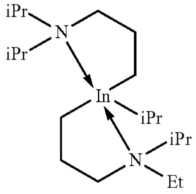
No. 314
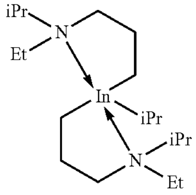
No. 315
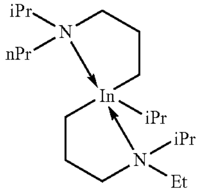
No. 316
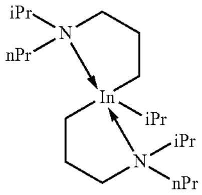
No. 317
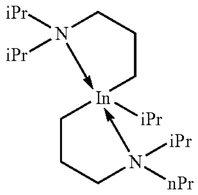
-continued
No. 318
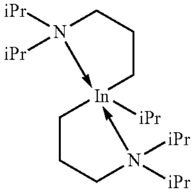
No. 319
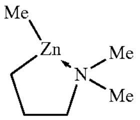
No. 320
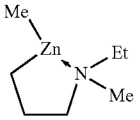
No. 321
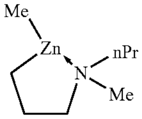
No. 322
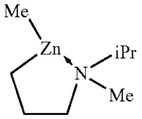
No. 323
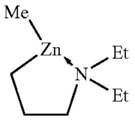
No. 324
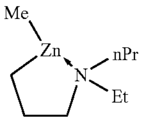
No. 325
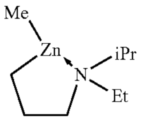
No. 326
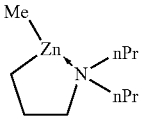
No. 327
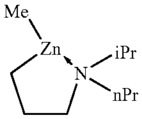
No. 328
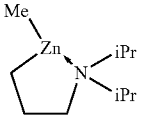

-continued
No. 329
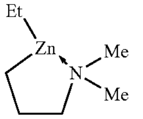
No. 330
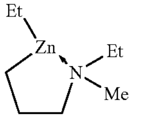
No. 331
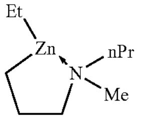
No. 332
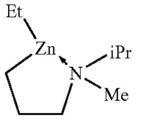
No. 333
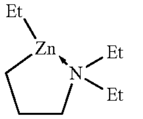
No. 334
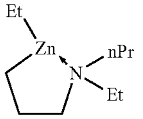
No. 335
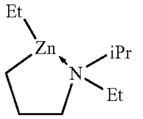
No. 336
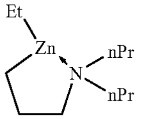
No. 337
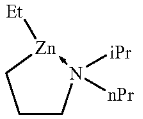
No. 338
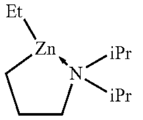
No. 339
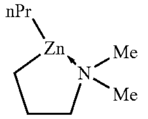
No. 340
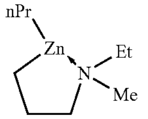
-continued
No. 341
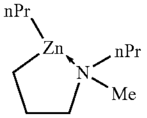
No. 342
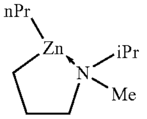
No. 343
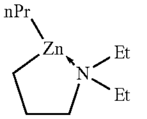
No. 344
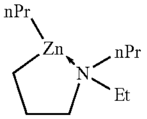
No. 345
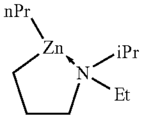
No. 346
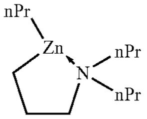
No. 347
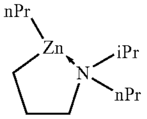
No. 348
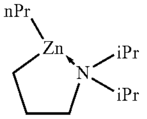
No. 349
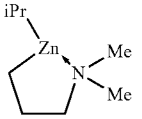
No. 350
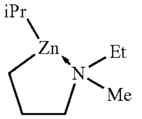
No. 351
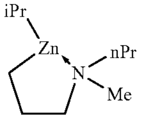
No. 352
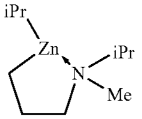

-continued
No. 353
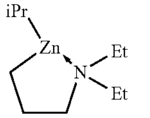
No. 354
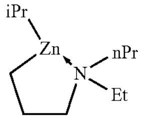
No. 355
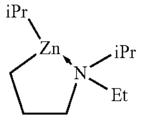
No. 356
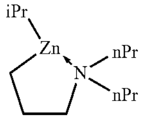
No. 357
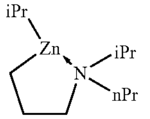
No. 358
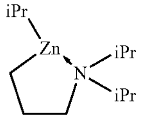
No. 359
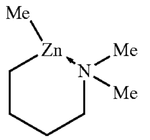
No. 360
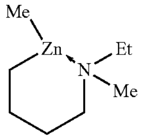
No. 361
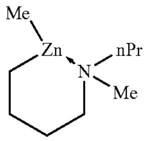
No. 362
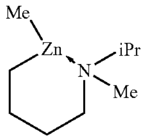
No. 363
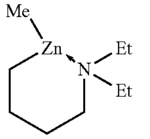
-continued
No. 364
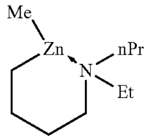
No. 365
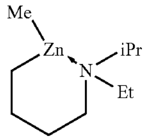
No. 366
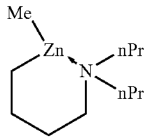
No. 367
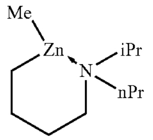
No. 368
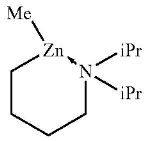
No. 369
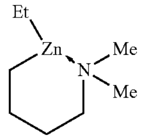
No. 370
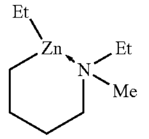
No. 371
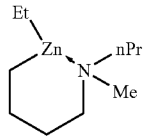
No. 372
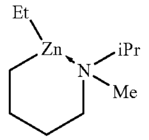
No. 373
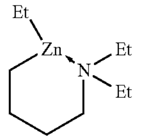

-continued
No. 374
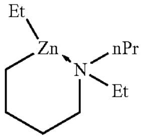
No. 375
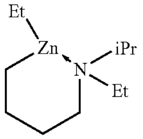
No. 376
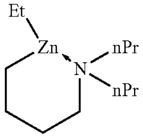
No. 377
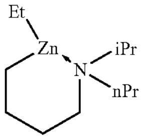
No. 378
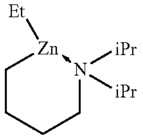
No. 379
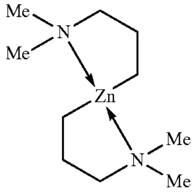
No. 380
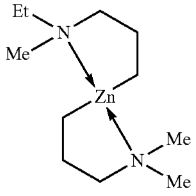
No. 381
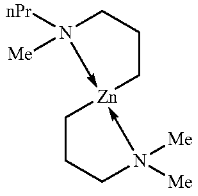
No. 382
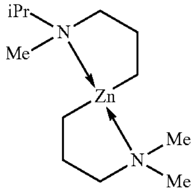
-continued
No. 383
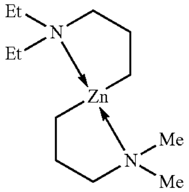
No. 384
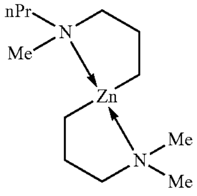
No. 385
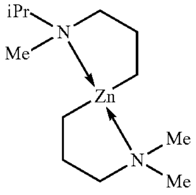
No. 386
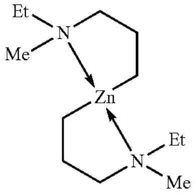
No. 387
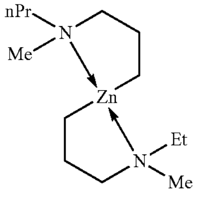
No. 388
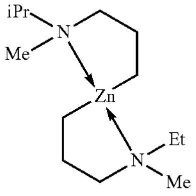
No. 389
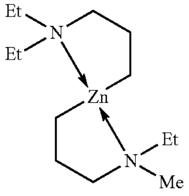
No. 390
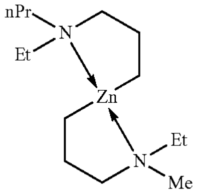

-continued
No. 391
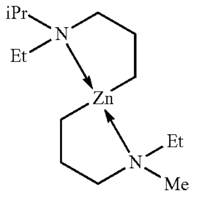
No. 392
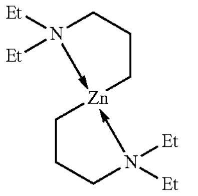
No. 393
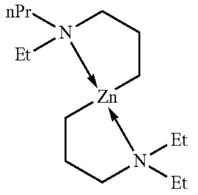
No. 394
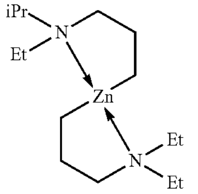
No. 395
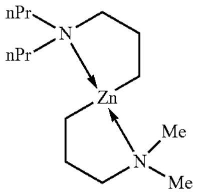
No. 396
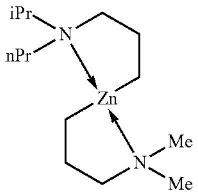
No. 397
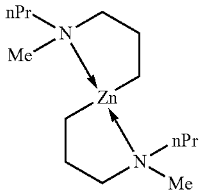
No. 398
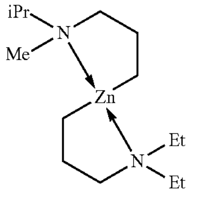
-continued
No. 399
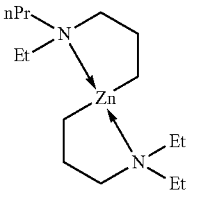
No. 400
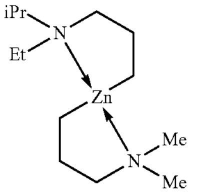
No. 401
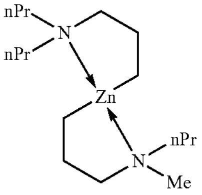
No. 402
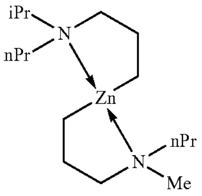
No. 403
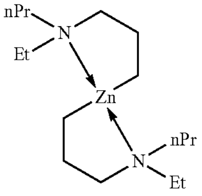
No. 404
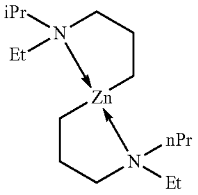
No. 405
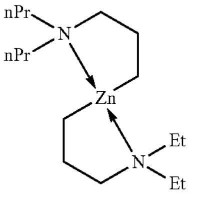
No. 406
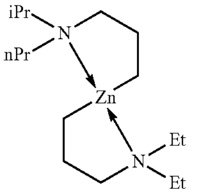

-continued
No. 407
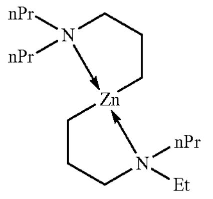
No. 408
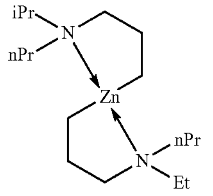
No. 409
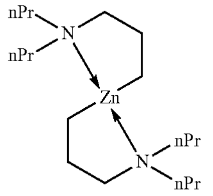
No. 410
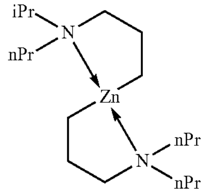
No. 411
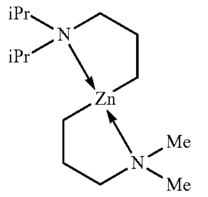
No. 412
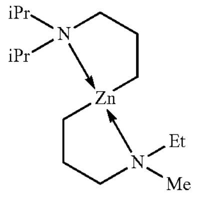
No. 413
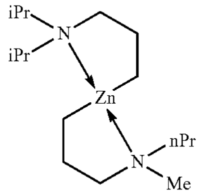
No. 414
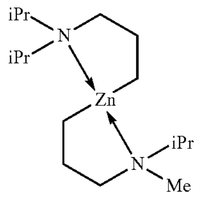
-continued
No. 415
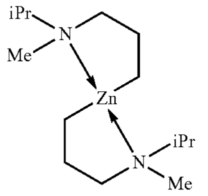
No. 416
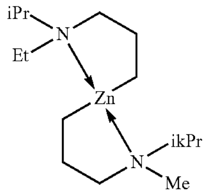
No. 417
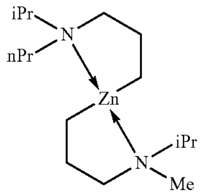
No. 418
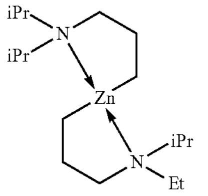
No. 419
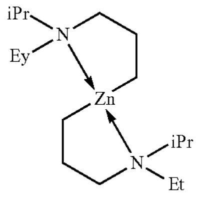
No. 420
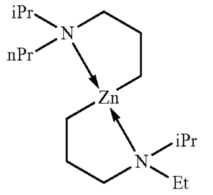
No. 421
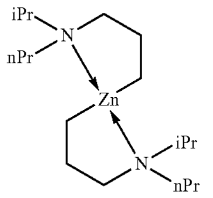
No. 422
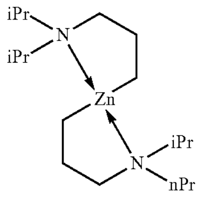

-continued

No. 423

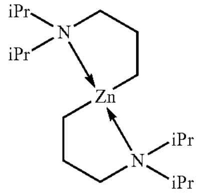

Of Compounds No. 1 to No. 423, Compounds No. 4, No. 20, No. 24, No. 333, No. 379, and No. 392 are preferred because these compounds each have a low melting point and handling thereof is easy, and Compounds No. 4, No. 20, No. 24, No. 333, and No. 392 are more preferred because these compounds are each a liquid at 25° C.

The compound represented by the general formula (1) may be produced through utilization of a well-known reaction. The compound represented by the general formula (1) may be obtained, for example, by subjecting indium chloride to a Grignard reaction with a Grignard reagent derived from a halogenated dialkylamine, followed by a reaction with an alkyllithium or a Grignard reagent, or by subjecting zinc chloride or a mixture of zinc chloride and a dialkylzinc to a Grignard reaction with a Grignard reagent derived from a halogenated dialkylamine.

The thin-film forming raw material, which is used in an atomic layer deposition method, of the present invention only needs to include the compound represented by the general formula (1), and the composition thereof varies depending on the kind of an intended thin-film. For example, when a thin-film containing only indium or zinc as a metal is produced, the thin-film forming raw material, which is used in an atomic layer deposition method, of the present invention is free of a compound of a metal except a corresponding metal and a semimetal compound. Meanwhile, when a thin-film containing indium or zinc and another metal and/or a semimetal is produced, the thin-film forming raw material, which is used in an atomic layer deposition method, of the present invention may include a compound containing a desired metal and/or a compound containing a semimetal (hereinafter also referred to as "other precursor") in addition to the compound represented by the general formula (1). The thin-film forming raw material, which is used in an atomic layer deposition method, of the present invention may further include an organic solvent and/or a nucleophilic reagent as described later.

In the case of the multi-component ALD method using a plurality of precursors, there is no particular limitation on the other precursor to be used together with the compound represented by the general formula (1), and well-known general precursors used in the thin-film forming raw material, which is used in an atomic layer deposition method, may be used.

Examples of the other precursor include compounds of: one kind or two or more kinds selected from the group consisting of compounds used as organic ligands, such as an alcohol compound, a glycol compound, a β-diketone compound, a cyclopentadiene compound, and an organic amine compound; and silicon or a metal. In addition, examples of the kind of the metal in the precursor include lithium, sodium, potassium, magnesium, calcium, strontium, barium, titanium, zirconium, hafnium, vanadium, niobium, tantalum, chromium, molybdenum, tungsten, manganese, iron, ruthenium, cobalt, rhodium, iridium, nickel, palladium, platinum, copper, silver, gold, zinc, aluminum, indium, germanium, tin, lead, antimony, bismuth, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1, 1, 1,5,5,5-hexafluoropentane-2,4-dione, and 1,3-diperfluorohexylpropane-1,3-dione; and ether-substituted ß-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene. Examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. As an example of the production method, for example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal. Examples of the alkali metal alkoxide may include a sodium alkoxide, a lithium alkoxide, and a potassium alkoxide.

In such a multi-component ALD method as described above, there are given a method involving vaporizing and supplying the thin-film forming raw material, which is used in an atomic layer deposition method, independently for each component (hereinafter sometimes referred to as "single source method"), and a method involving vaporizing and supplying a mixed raw material obtained by mixing a multi-component raw material with desired composition in advance (hereinafter sometimes referred to as "cocktail source method"). In the case of the single source method, the above-mentioned other precursor is preferably a compound which is similar to the compound represented by the general formula (1) in the behavior of thermal decomposition and/or oxidative decomposition. In the case of the cocktail source method, the above-mentioned other precursor is preferably a compound which is similar to the compound represented by the general formula (1) in the behavior of thermal decomposition and/or oxidative decomposition, and in addition, which causes no change through a chemical reaction or the like at the time of mixing.

In the case of the cocktail source method out of the multi-component ALD methods, a mixture of the compound represented by the general formula (1) and the other precursor or a mixed solution obtained by dissolving the mixture in an organic solvent may be used as the thin-film forming raw material, which is used in an atomic layer deposition method.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, a relationship among a use temperature, a boiling point, and a flash point, and the like.

When the thin-film forming raw material, which is used in an atomic layer deposition method, is the mixed solution including the above-mentioned organic solvent, the amount of the entire precursors in the thin-film forming raw material, which is used in an atomic layer deposition method, only needs to be controlled to from 0.01 mol/liter to 2.0 mol/liter, particularly from 0.05 mol/liter to 1.0 mol/liter.

Herein, when the thin-film forming raw material, which is used in an atomic layer deposition method, is free of any precursor other than the compound represented by the general formula (1), the amount of the entire precursors refers to the amount of the compound represented by the general formula (1). When the thin-film forming raw material, which is used in an atomic layer deposition method, includes any other precursor in addition to the compound represented by the general formula (1), the amount of the entire precursors refers to the total amount of the compound represented by the general formula (1) and the other precursor.

In addition, the thin-film forming raw material, which is used in an atomic layer deposition method, of the present invention may include a nucleophilic reagent as required in order to improve the stability of each of the compound represented by the general formula (1) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1, 1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents falls within preferably the range of from 0.1 mol to 10 mol, more preferably the range of from 1 mol to 4 mol with respect to 1 mol of the amount of the entire precursors from the viewpoint that an effect commensurate with the usage amount is easily obtained.

The thin-film forming raw material, which is used in an atomic layer deposition method, of the present invention is preferably prevented from including impurity metal elements other than the components for forming the raw material, impurity halogens such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less. In addition, moisture causes generation of particles in the thin-film forming raw material, which is used in an atomic layer deposition method, and generation of particles during thin-film formation, and hence it is better to remove moisture in the precursor, the organic solvent, and the nucleophilic reagent as much as possible in advance at the time of use in order to reduce moisture in each of the precursor, the organic solvent, and the nucleophilic reagent. The moisture content of each of the precursor, the organic solvent, and the nucleophilic reagent is preferably 10 ppm or less, more preferably 1 ppm or less.

In addition, it is preferred that the thin-film forming raw material, which is used in an atomic layer deposition method, of the present invention be prevented from including particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is still more preferred that the number of particles larger than 0.2 μm be 100 or less in 1 mL of the liquid phase.

The form of the thin-film forming raw material, which is used in an atomic layer deposition method, of the present invention is appropriately selected by a procedure such as a transportation and supply method of the atomic layer deposition method to be used.

Examples of the transportation and supply method include: a gas transportation method including vaporizing the thin-film forming raw material, which is used in an atomic layer deposition method, of the present invention stored in a raw material container through heating and/or decompression, to thereby obtain a raw material gas, and introducing the raw material gas into a film formation chamber having a substrate set therein together with a carrier gas, such as argon, nitrogen, or helium, as required; and a liquid transportation method including transporting the thin-film forming raw material, which is used in an atomic layer deposition method, of the present invention to a vaporization chamber under a state of a liquid or a solution, vaporizing the raw material in the vaporization chamber through heating and/or decompression, to thereby obtain a raw material gas, and introducing the raw material gas into a film formation chamber having a substrate set therein. In the case of the gas transportation method, the very compound represented by the general formula (1) may be used as the thin-film forming raw material, which is used in an atomic layer deposition method. In the case of the liquid transportation method, the very compound represented by the general formula (1) or a mixed solution obtained by dissolving the compound in an organic solvent may be used as the thin-film forming raw material, which is used in an atomic layer deposition method.

Next, a method of producing a thin-film of the present invention is described. In the method of producing a thin-film of the present invention, an indium-containing thin-film or a zinc-containing thin-film is formed on the surface of a substrate by an ALD method using the above-mentioned thin-film forming raw material, which is used in an atomic layer deposition method.

Herein, as one embodiment, a method of producing an indium-containing thin-film by an ALD method is described. A method of producing a zinc-containing thin-film may be performed by replacing the term "indium atom" in the method of producing an indium-containing thin-film with the term "zinc atom."

Figure 2:
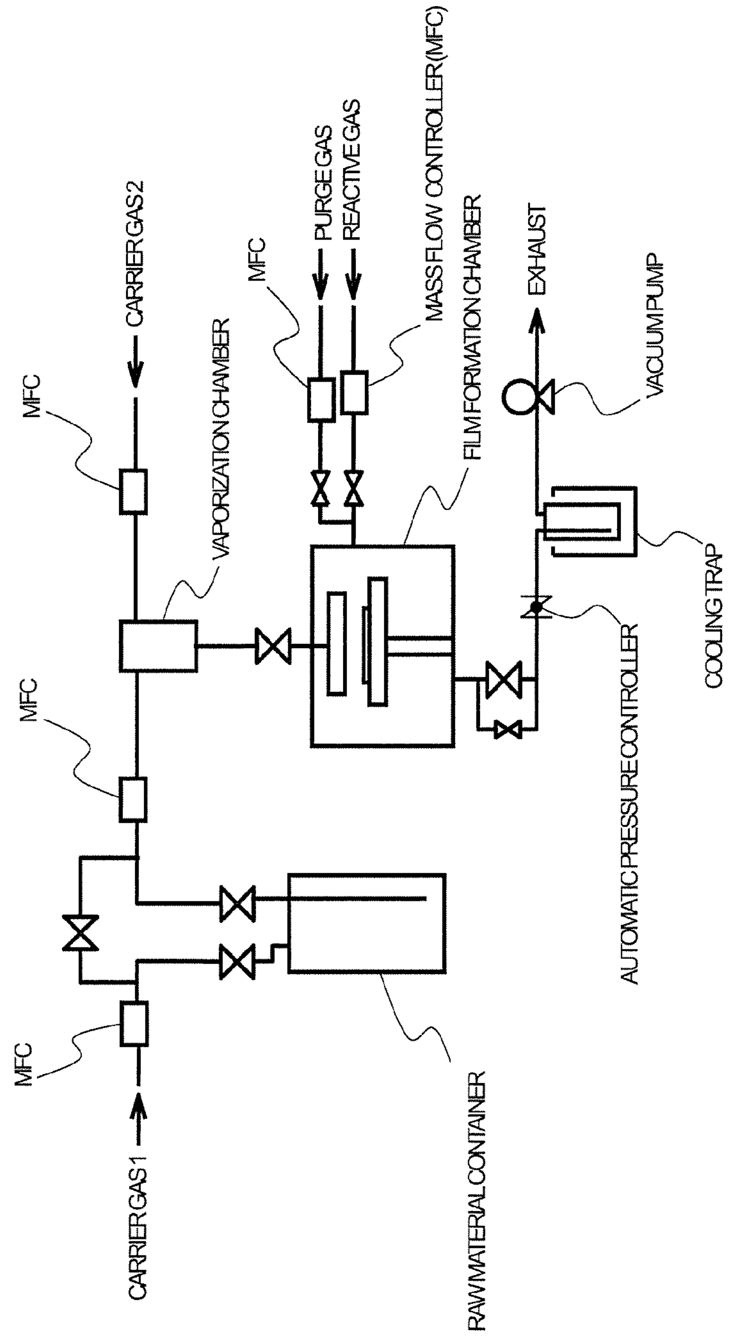
FIG. 2 is a schematic diagram for illustrating another example of the ALD apparatus to be used in the method of producing a thin-film of the present invention.

As specific examples of an ALD apparatus to be used in the method of producing a thin-film of the present invention, there are given: such an apparatus as illustrated in FIG. 1 capable of vaporizing the thin-film forming raw material, which is used in an atomic layer deposition method, in a raw material container through heating and/or decompression, to thereby obtain a raw material gas, and supplying the raw material gas to a film formation chamber together with a carrier gas as required; and such an apparatus as illustrated in FIG. 2 capable of transporting the thin-film forming raw material, which is used in an atomic layer deposition method, in the raw material container to a vaporization chamber under a state of a liquid or a solution, vaporizing the raw material in the vaporization chamber through heating and/or decompression, to thereby obtain a raw material gas, and supplying the raw material gas to the film formation chamber. The ALD apparatus is not limited to such single-substrate type apparatus as illustrated in FIG. 1 and FIG. 2 each including the film formation chamber, and an apparatus capable of simultaneously processing a large number of substrates through use of a batch furnace may also be used.

The method of producing a thin-film of the present invention includes: a step 1 (precursor thin-film formation step) of introducing a raw material gas obtained by vaporizing the above-mentioned thin-film forming raw material, which is used in an atomic layer deposition method, into a film formation chamber having set therein a substrate to cause the raw material gas to adsorb to the surface of the substrate, to thereby form a precursor thin-film; a step 2 (evacuation step) of evacuating the raw material gas remaining unreacted; and a step 3 (indium-containing thin-film formation step) of introducing a reactive gas into the film formation chamber to cause the precursor thin-film to react with the reactive gas, to thereby form an indium-containing thin-film on the surface of the substrate.

In addition, the method of producing a thin-film of the present invention preferably includes, after the step 3, a step 4 (evacuation step) of evacuating a gas in the film formation chamber.

In the method of producing a thin-film of the present invention, deposition performed by a series of operations in which the step 1 (precursor thin-film formation step), the step 2 (evacuation step), the step 3 (indium-containing thin-film formation step), and the step 4 (evacuation step) are sequentially performed is defined as one cycle, and the thickness of the thin-film can be controlled by repeating this cycle. The respective steps of the method of producing a thin-film of the present invention are described below.

Step 1

The step 1 is a step of introducing a raw material gas obtained by vaporizing the above-mentioned thin-film forming raw material, which is used in an atomic layer deposition method, into a film formation chamber having set therein a substrate to cause the raw material gas to adsorb to the surface of the substrate, to thereby form a precursor thin-film. As a method of introducing the raw material gas obtained by vaporizing the above-mentioned thin-film forming raw material, which is used in an atomic layer deposition method, into the film formation chamber having set therein the substrate, there are given: a gas transportation method as illustrated in each of FIG. 1 and FIG. 3 including vaporizing the thin-film forming raw material, which is used in an atomic layer deposition method, in a raw material container through heating and/or decompression, to thereby obtain a raw material gas, and introducing the raw material gas into a film formation chamber together with a carrier gas, such as argon, nitrogen, or helium, as required; and a liquid transportation method as illustrated in each of FIG. 2 and FIG. 4 including transporting the thin-film forming raw material, which is used in an atomic layer deposition method, in the raw material container to a vaporization chamber under a state of a liquid or a solution, vaporizing the thin-film forming raw material, which is used in an atomic layer deposition method, in the vaporization chamber through heating and/or decompression, to thereby obtain a raw material gas, and introducing the raw material gas into the film formation chamber. In the case of the gas transportation method, the very compound represented by the general formula (1) may be used as the thin-film forming raw material, which is used in an atomic layer deposition method. In the case of the liquid transportation method, the compound represented by the general formula (1) or a mixed solution obtained by dissolving the compound in an organic solvent may be used as the thin-film forming raw material, which is used in an atomic layer deposition method. Those thin-film forming raw materials, which are used in an atomic layer deposition method, may each further include a nucleophilic reagent and the like.

In addition, the single source method and the cocktail source method, which have been described as the multi-component ALD methods each including a plurality of precursors, may also be given as examples of the method of introducing the raw material gas into the film formation chamber, in addition to the above-mentioned gas transportation method and liquid transportation method. However, no matter which one of the introduction methods is used, the thin-film forming raw material, which is used in an atomic layer deposition method, to be used in the method of producing a thin-film of the present invention is preferably vaporized in the range of 0° C. or more and 200° C. or less from the viewpoint of handleability. In addition, when the thin-film forming raw material, which is used in an atomic layer deposition method, is vaporized to provide the raw material gas in the raw material container or in the vaporization chamber, the pressure in the raw material container and the pressure in the vaporization chamber are each preferably 1 Pa or more and 10,000 Pa or less from the viewpoint that the thin-film forming raw material, which is used in an atomic layer deposition method, is easily vaporized.

Herein, as a material for the substrate to be set in the film formation chamber, there are given, for example: silicon; ceramics, such as silicon nitride, titanium nitride, tantalum nitride, titanium oxide, ruthenium oxide, zirconium oxide, hafnium oxide, and lanthanum oxide; glass; and metals, such as metal cobalt and metal ruthenium. The shape of the substrate is, for example, a plate shape, a spherical shape, a fibrous shape, or a scaly shape. The surface of the substrate may be planar, or may have a three-dimensional structure such as a trench structure.

After the raw material gas is introduced into the film formation chamber, the precursor thin-film can be formed on the surface of the substrate by causing the raw material gas to adsorb to the surface of the substrate. At this time, the substrate may be heated, or an inside of the film formation chamber may be heated. The conditions under which the precursor thin-film is formed are not particularly limited, and for example, an adsorption temperature (substrate temperature), a system pressure, or the like may be appropriately determined depending on the kind of the thin-film forming raw material, which is used in an atomic layer deposition method. When the thin-film forming raw material, which is used in an atomic layer deposition method, including an indium compound represented by the general formula (1) is used, the step 1 is preferably performed under a state in which the substrate is heated to 50° C. or more and 400° C. or less. From the viewpoint that a uniform precursor thin-film is easily obtained, the step 1 is more preferably performed under a state in which the substrate is heated to 100° C. or more and 300° C. or less. When the thin-film forming raw material, which is used in an atomic layer deposition method, including a zinc compound represented by the general formula (1) is used, the step 1 is preferably performed under a state in which the substrate is heated to 50° C. or more and 400° C. or less. From the viewpoint that a uniform precursor thin-film is easily obtained, the step 1 is more preferably performed under a state in which the substrate is heated to 100° C. or more and 300° C. or less. The system pressure is not particularly limited, but is preferably 1 Pa or more and 10,000 Pa or less. From the viewpoint that a uniform precursor thin-film is easily obtained, the system pressure is more preferably 10 Pa or more and 1,000 Pa or less.

Step 2

The step 2 is a step of evacuating, after the formation of the precursor thin-film, the unreacted raw material gas not having adsorbed to the surface of the substrate from the film formation chamber. In this step, it is ideal that the raw material gas not having adsorbed be completely evacuated from the film formation chamber, but it is not always required that the gas be completely evacuated. As an evacuation method, there are given, for example: a method involving purging the system of the film formation chamber with an inert gas, such as helium, nitrogen, or argon; a method involving performing evacuation by decompressing the system; and a combination of these methods. The degree of decompression in the case of decompressing the system preferably falls within the range of 0.01 Pa or more and 300 Pa or less, and from the viewpoint that the evacuation of the raw material gas not having adsorbed is promoted, the degree of decompression more preferably falls within the range of 0.01 Pa or more and 100 Pa or less.

Step 3

The step 3 is a step of introducing, after the step 2, a reactive gas into the film formation chamber to cause the precursor thin-film formed on the surface of the substrate to react with the reactive gas through the action of the reactive gas and the action of heat, to thereby form an indium-containing thin-film.

Examples of the reactive gas include: oxidizing gases, such as oxygen, ozone, nitrogen dioxide, nitrogen monoxide, water vapor, hydrogen peroxide, formic acid, acetic acid, and acetic anhydride; reducing gases such as hydrogen; and nitriding gases, such as organic amine compounds including a monoalkylamine, a dialkylamine, a trialkylamine, and an alkylenediamine, hydrazine, and ammonia. Those reactive gases may be used alone or as a mixture thereof. In the method of producing a thin-film of the present invention, the reactive gas is preferably an oxidizing gas, and from the viewpoint that reactivity between the precursor thin-film and the reactive gas is satisfactory, the reactive gas is more preferably a gas containing at least one selected from the group consisting of: oxygen; ozone; and water vapor. When the oxidizing gas is used as the reactive gas, a thin-film of indium oxide is formed as the indium-containing thin-film, and a thin-film of zinc oxide is formed as the zinc-containing thin-film.

When the thin-film forming raw material, which is used in an atomic layer deposition method, including the indium compound represented by the general formula (1) is used, a temperature (substrate temperature) at which the precursor thin-film is caused to react with the reactive gas is 50° C. or more and 400° C. or less, and from the viewpoint that a high-quality thin-film having a smaller residual carbon amount is obtained, the temperature is more preferably 100° C. or more and 300° C. or less. When the thin-film forming raw material, which is used in an atomic layer deposition method, including the zinc compound represented by the general formula (1) is used, a temperature (substrate temperature) at which the precursor thin-film is caused to react with the reactive gas is 50° C. or more and 400° C. or less, and from the viewpoint that a high-quality thin-film having a smaller residual carbon amount is obtained, the temperature is more preferably 100° C. or more and 300° C. or less. In addition, a pressure in the film formation chamber at the time of performing the step 3 is preferably 1 Pa or more and 10,000 Pa or less, and from the viewpoint that reactivity between the precursor thin-film and the reactive gas becomes satisfactory, the pressure is more preferably 10 Pa or more and 1,000 Pa or less.

Step 4

The step 4 is a step of evacuating, after the step 3, the reactive gas remaining unreacted and a by-product gas from the film formation chamber in order to produce a high-quality thin-film. The reactive gas remaining unreacted represents the reactive gas not having reacted with the precursor thin-film in the step 3. In addition, the by-product gas represents a gas generated after the precursor thin-film is caused to react with the reactive gas in the step 3. In this step, it is ideal that the reactive gas and the by-product gas be completely evacuated from the film formation chamber. However, it is not always required that the gases be completely evacuated. An evacuation method and a decompression degree when decompression is performed are the same as those of the step 2 described above.

In the method of producing a thin-film of the present invention, a series of operations including the step 1, the step 2, the step 3, and the optional step 4 described above is defined as one cycle, and the film thickness of the indium-containing thin-film to be obtained can be controlled by the number of the cycles.

Figure 3:
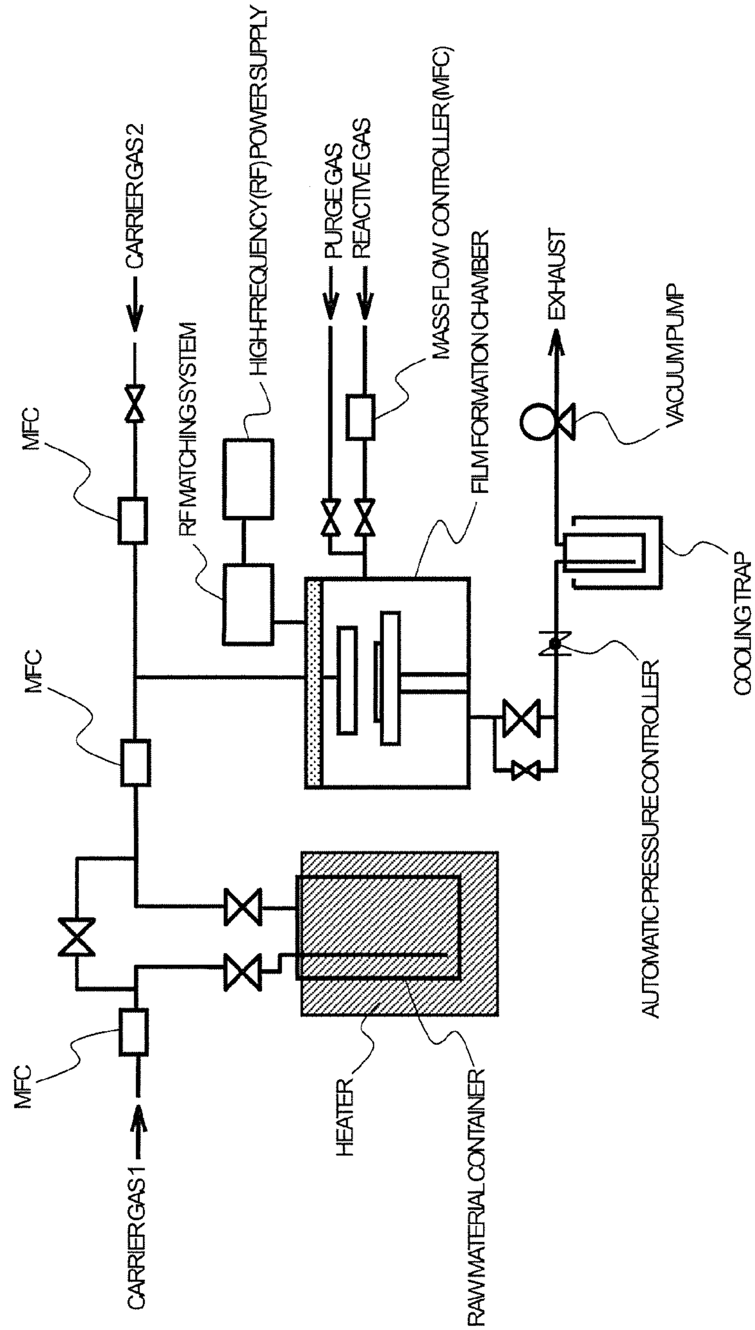
FIG. 3 is a schematic diagram for illustrating still another example of the ALD apparatus to be used in the method of producing a thin-film of the present invention.
Figure 4:
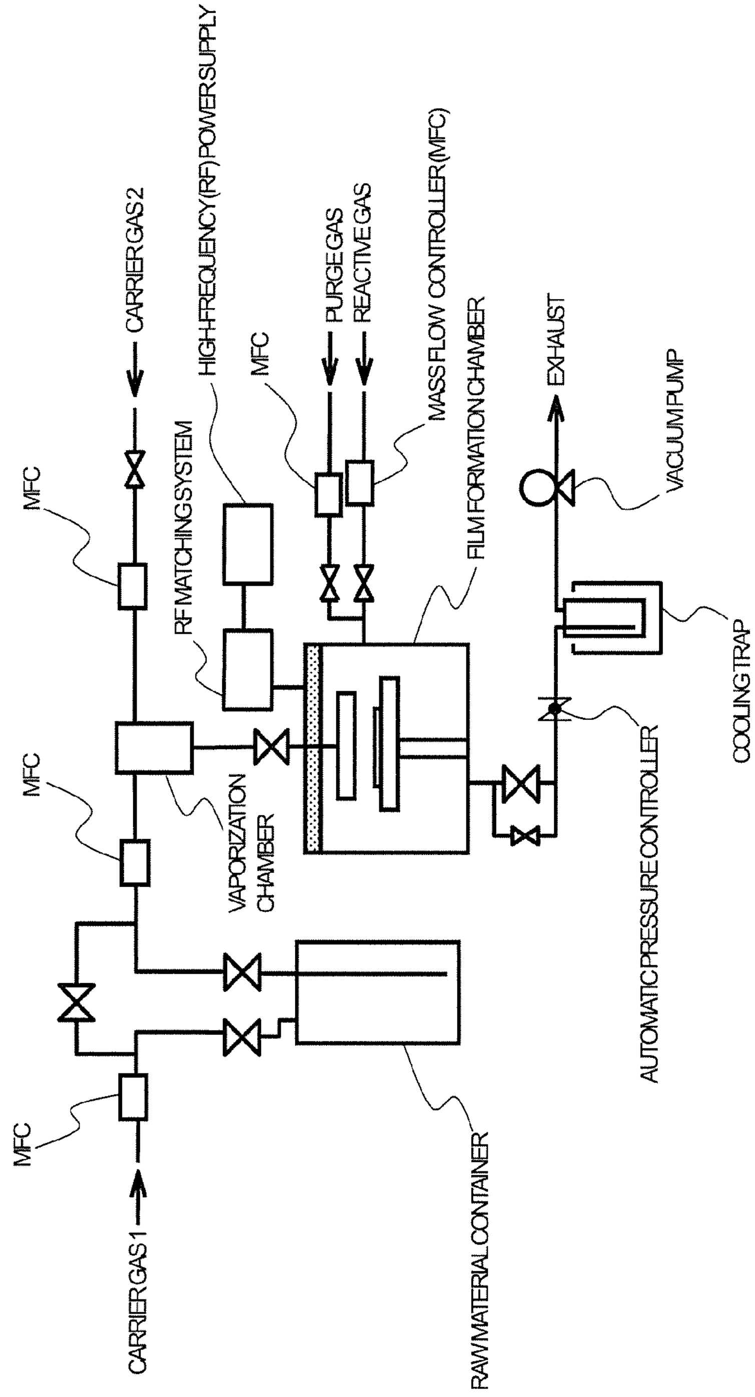
FIG. 4 is a schematic diagram for illustrating yet still another example of the ALD apparatus to be used in the method of producing a thin-film of the present invention.

In addition, in the method of producing a thin-film of the present invention, energy, such as plasma, light, or a voltage, may be applied in the film formation chamber as illustrated in each of FIG. 3 and FIG. 4, or a catalyst may be used therein. The timing at which the energy is applied and the timing at which the catalyst is used are not particularly limited. The energy may be applied or the catalyst may be used, for example, at the time of the introduction of the raw material gas into the film formation chamber or at the time of the heating in forming the precursor thin-film in the step 1, at the time of the introduction of the reactive gas into the film formation chamber or at the time of causing the reactive gas and the precursor thin-film to react with each other in the step 3, at the time of the evacuation of the system in the step 2 or the step 4, or between the above-mentioned respective steps.

In addition, in the method of producing a thin-film of the present invention, after the thin-film formation, annealing treatment may be performed under an inert atmosphere, an oxidizing atmosphere, or a reducing atmosphere in order to obtain more satisfactory electrical characteristics. When step embedding is required, a reflow step may be provided. A temperature in this case is preferably 200° C. or more and 1,000° C. or less, and from the viewpoint that damage to the thin-film or the substrate caused by heat can be suppressed, the temperature is more preferably 250° C. or more and 500° C. or less.

A thin-film produced by the method of producing a thin-film of the present invention may be formed as desired kinds of thin-films through the coating of a substrate made of, for example, a metal, an oxide ceramic, a nitride ceramic, or glass, by appropriately selecting the other precursor, the reactive gas, and the production conditions. The thin-film of the present invention is excellent in electrical characteristics and optical characteristics, and hence may be widely used for the production of, for example, electrode materials for memory elements typified by DRAM elements, resistance films, diamagnetic films used in recording layers of hard disks, and catalyst materials for polymer electrolyte fuel cells.

A zinc compound of the present invention is a compound represented by the above-mentioned general formula (2). The zinc compound is applicable to an atomic layer deposition method, and hence may be suitably used in the thin-film forming raw material, which is used in an atomic layer deposition method.

Examples of the linear or branched alkyl group having 2 to 4 carbon atoms represented by each of $R^5$ and $R^6$ in the general formula (2) include an ethyl group, a n-propyl group, an isopropyl group, a n-butyl group, an isobutyl group, a sec-butyl group, and a tert-butyl group.

Examples of the linear or branched alkylene group having 1 to 4 carbon atoms represented by $A^2$ in the general formula (2) include a methylene group, an ethylene group, a propylene group, a 1,1-dimethylmethylene group, a 1-methylpropylene group, a 2-methylpropylene group, and a butylene group.

It is preferred to appropriately combine $A^2$, $R^4$, $R^5$, and $R^6$ depending on the method of producing a thin-film in which the zinc compound represented by the general formula (2) is used. For example, a zinc compound in which $R^4$ represents a methyl group or an ethyl group, and $R^5$ and $R^6$ each independently represent an ethyl group or a propyl group is preferred because such compound has a low melting point, and a high-quality zinc-containing thin-film having a small residual carbon amount is easily obtained. In addition, a zinc compound in which $A^2$ represents an ethylene group, a propylene group, or a butylene group is preferred because such compound has satisfactory reactivity with the oxidizing gas, and a zinc compound in which $A^2$ represents a propylene group is more preferred. A zinc compound in which $R^4$ represents a methyl group or an ethyl group, $R^5$ and $R^6$ each represent an ethyl group, and $A^2$ represents a propylene group is still more preferred because the production of a high-quality zinc-containing thin-film having a small residual carbon amount is facilitated.

Examples of the zinc compound represented by the general formula (2) include Zinc Compounds No. 323, No. 324, No. 325, No. 326, No. 327, No. 328, No. 333, No. 334, No. 335, No. 336, No. 337, No. 338, No. 363, No. 364, No. 365, No. 366, No. 367, No. 368, No. 373, No. 374, No. 375, No. 376, No. 377, and No. 378. Of those zinc compounds, Zinc Compound No. 333 is more preferred from the viewpoint that the compound has a low melting point and has satisfactory vapor properties.

The compound represented by the general formula (2) of the present invention may be produced through utilization of a well-known reaction. The compound represented by the general formula (2) may be obtained, for example, by subjecting zinc chloride or a mixture of zinc chloride and a dialkylzinc to a Grignard reaction with a Grignard reagent derived from a halogenated dialkylamine.

EXAMPLES

Hereinafter, the present invention is described in more detail by way of Examples. However, the present invention is not limited by the following Examples and the like.

[Example 1] Synthesis of Indium Compound No. 4

2.92 Grams (120.0 mmol) of metal magnesium was loaded into a 300 ml four-necked flask. The flask was brought under an argon atmosphere, and then 108.17 g (1.50 mol) of dehydrated tetrahydrofuran and 1.88 g (10.0 mmol) of dibromoethane were added thereto, followed by stirring in an oil bath at 60° C. After that, 14.97 g (100.0 mmol) of 3-(diethylaminopropyl)chloride was dropped thereinto, followed by heating reflux for 4 hours, to thereby prepare a Grignard reagent. Next, a mixed solution obtained by loading 22.18 g (100.0 mmol) of trichloroindium and 138.21 g (1.50 mol) of dehydrated toluene into a 500 ml four-necked flask was stirred under ice cooling. After the temperature of the mixed solution reached 10° C. or less, the Grignard reagent was dropped thereinto. After the dropping, the temperature was increased to room temperature, followed by stirring for 18 hours. After the stirring, tetrahydrofuran was distilled away through decompression treatment in an oil bath at 70° C. After the solution remaining in the flask was subjected to filtration, toluene was distilled away through decompression treatment in an oil bath at 100° C. The solution remaining in the flask was returned to room temperature, and was dried under reduced pressure conditions. Thus, 27.32 g (91.1 mmol) of 3-(diethylaminopropyl)indium dichloride as an orange solid was obtained.

A mixed solution obtained by loading 1.16 g (3.9 mmol) of 3-(diethylaminopropyl)indium dichloride and 4.99 g (57.9 mmol) of dehydrated hexane into a 100 ml four-necked flask was stirred under ice cooling. After the temperature of the mixed solution reached 10° C. or less, 7.0 ml (8.1 mmol) of methyllithium (1.16 M diethyl ether solution) was dropped thereinto. After the dropping, the temperature was increased to room temperature, followed by stirring for 3 hours. After the stirring, the solution remaining in the flask was subjected to filtration. The resultant filtrate was loaded into a flask, and diethyl ether and hexane were distilled away through decompression treatment in an oil bath at 60° C. A white liquid remaining in the flask was distilled under reduced pressure (80 Pa) conditions. Thus, 0.29 g (1.1 mmol, yield: 26%) of a colorless transparent liquid was obtained as a distillate. The resultant colorless transparent liquid was subjected to $^1$H-NMR and ICP-AES analysis, and as a result, was identified as Indium Compound No. 4 that was a target compound. The $^1$H-NMR and ICP-AES analysis results of the resultant colorless transparent liquid are shown below.

(1) $^1$H-NMR (deuterated benzene)

−0.105 ppm (6H, singlet), 0.516 ppm (6H, d=7.2, triplet), 0.627 ppm (2H, d=7.2, triplet), 1.714-1.779 ppm (2H, multiplet), 1.938-1.967 ppm (2H, multiplet), 2.112-2.181 ppm (2H, multiplet), 2.233-2.303 ppm (2H, multiplet)

(2) ICP-AES

Indium content: 44.7 mass % (theoretical value: 44.3 mass %)

[Example 2] Synthesis of Indium Compound No. 20

2.15 Grams (88.3 mmol) of metal magnesium was loaded into a 200 ml four-necked flask. The flask was brought under an argon atmosphere, and then 79.57 g (1.10 mol) of dehydrated tetrahydrofuran and 1.38 g (7.4 mmol) of dibromoethane were added thereto, followed by stirring in an oil bath at 60° C. After that, 10.53 g (73.6 mmol) of 3-(dimethylaminopropyl)chloride was dropped thereinto, followed by heating reflux for 6 hours, to thereby prepare a Grignard reagent. Next, a mixed solution obtained by loading 16.27 g (73.6 mmol) of trichloroindium and 101.67 g (1.10 mol) of dehydrated toluene into a 500 ml four-necked flask was stirred under ice cooling. After the temperature of the mixed solution reached 10° C. or less, the Grignard reagent was dropped thereinto. After the dropping, the temperature was increased to room temperature, followed by stirring for 20 hours. Tetrahydrofuran was distilled away through decompression treatment in an oil bath at 70° C. After the solution remaining in the flask was subjected to filtration, toluene was distilled away through decompression treatment in an oil bath at 70° C. Thus, 18.42 g (67.8 mmol) of 3-(dimethylaminopropyl)indium dichloride as a while solid was obtained.

A mixed solution obtained by loading 13.00 g (47.8 mmol) of 3-(dimethylaminopropyl)indium dichloride and 41.21 g (478 mmol) of dehydrated hexane into a 300 ml four-necked flask was stirred under ice cooling. After the temperature of the mixed solution reached 10° C. or less, 110.7 ml (105 mmol) of ethylmagnesium bromide (0.95 M tetrahydrofuran solution) serving as a Grignard reagent was dropped thereinto. After the dropping, the temperature was increased to room temperature, followed by stirring for 18 hours. After the stirring, tetrahydrofuran was distilled away through decompression treatment in an oil bath at 100° C. After the solution remaining in the flask was subjected to filtration, hexane was distilled away through decompression treatment in an oil bath at 100° C. A pale yellow liquid remaining in the flask was distilled under reduced pressure (60 Pa). Thus, 2.76 g (10.7 mmol, yield: 21%) of a colorless transparent liquid was obtained as a distillate. The resultant colorless transparent liquid was subjected to $^1$H-NMR and ICP-AES analysis, and as a result, was identified as Indium Compound No. 20 that was a target compound. The $^1$H-NMR and ICP-AES analysis results of the resultant colorless transparent liquid are shown below.

(1) $^1$H-NMR (deuterated benzene)

0.655 ppm (4H, d=8.1, triplet), 1.548 ppm (6H, d=8.1, triplet), 1.730 ppm (6H, s inglet), 1.677-1.767 ppm (6H, multiplet)

(2) ICP-AES

Indium content: 44.0 mass % (theoretical value: 44.3 mass %)

[Example 3] Synthesis of Indium Compound No. 24

1.31 Grams (54 mmol) of metal magnesium was loaded into a 300 ml four-necked flask. The flask was brought under an argon atmosphere, and then 53.4 g (740 mmol) of dehydrated tetrahydrofuran and 0.85 g (4.5 mmol) of dibromoethane were added thereto, followed by stirring in an oil bath at 60° C. After that, 6.73 g (45 mmol) of 3-(diethylaminopropyl)chloride was dropped thereinto, followed by heating reflux for 4 hours, to thereby prepare a Grignard reagent. Next, a mixed solution obtained by loading 10.00 g (45 mmol) of trichloroindium and 104.12 g (1.13 mol) of dehydrated toluene into a 500 ml four-necked flask was stirred under ice cooling. After the temperature of the mixed solution reached 10° C. or less, the Grignard reagent was dropped thereinto. After the dropping, the temperature was increased to room temperature, followed by stirring for 16 hours. After the stirring, tetrahydrofuran was distilled away through decompression treatment. The mixed solution having added thereto 100 ml (760 mmol) of hexane was stirred under ice cooling. After the temperature of the mixed solution reached 10° C. or less, 31.5 ml (95 mmol) of ethylmagnesium bromide (3 M diethyl ether solution) serving as a Grignard reagent was dropped thereinto. After the dropping, the temperature was increased to room temperature, followed by stirring for 20 hours. After the stirring, filtration was performed, the resultant filtrate was loaded into a flask, and diethyl ether, hexane, and toluene were distilled away through decompression treatment in an oil bath at 90° C. A pale yellow liquid remaining in the flask was distilled under reduced pressure (60 Pa). Thus, 6.32 g (22 mmol, yield: 49%) of a colorless transparent liquid was obtained as a distillate. The resultant colorless transparent liquid was subjected to $^1$H-NMR and ICP-AES analysis, and as a result, was identified as Indium Compound No. 24 that was a target compound. The $^1$H-NMR and ICP-AES analysis results of the resultant colorless transparent liquid are shown below.

(1) $^1$H-NMR (deuterated benzene) 0.541 ppm (6H, triplet), 0.652 ppm (6H, multiplet), 1.563 ppm (6H, triplet), 1.756 ppm (2H, multiplet), 1.971 ppm (2H, multiplet), 2.194 ppm (2H, multiplet), 2.309 ppm (2H, multiplet)

(2) ICP-AES Indium content: 40.2 mass % (theoretical value: 40.0 mass %)

[Example 4] Synthesis of Zinc Compound No. 333

A mixed solution obtained by loading 5.93 g (48 mmol) of diethylzinc, 6.54 g (48 mmol) of dichlorozinc, and 120 ml of dehydrated ether into a 500 ml four-necked flask was stirred under ice cooling. After the temperature of the mixed solution reached 10° C. or less, 16.7 g (96 mmol) of 3-diethylamino-propylmagnesium chloride serving as a Grignard reagent was dropped thereinto. After the dropping, the temperature was increased to room temperature, followed by stirring for 22 hours. After the stirring, ether was distilled away in an oil bath at 50° C. under normal pressure conditions. After that, toluene was added, and filtration was performed. The resultant filtrate was loaded into a flask, and toluene was distilled away through decompression treatment in an oil bath at 100° C. A colorless transparent liquid remaining in the flask was distilled under reduced pressure (50 Pa) conditions. Thus, 1.50 g (7.2 mmol, yield: 7.5%) of a colorless transparent liquid was obtained as a distillate. The resultant colorless transparent liquid was subjected to $^1$H-NMR and ICP-AES analysis, and as a result, was identified as Zinc Compound No. 333 that was a target compound. The $^1$H-NMR and ICP-AES analysis results of the resultant colorless transparent liquid are shown below.

(1) $^1$H-NMR (deuterated benzene)

0.273 ppm (2H, multiplet), 0.442 ppm (2H, multiplet), 0.722 ppm (6H, triplet), 1.491 ppm (3H, multiplet), 1.729 ppm (2H, multiplet), 1.976 ppm (2H, multiplet), 2.159 ppm (4H, quartet)

(2) ICP-AES

Zinc content: 31.6 mass % (theoretical value: 31.3 mass %)

[Example 5] Synthesis of Zinc Compound No. 379

2.20 Grams (0.0911 mol) of metal magnesium was loaded into a 500 ml four-necked flask. The flask was brought under an argon atmosphere, and then 400 ml of dehydrated tetrahydrofuran and 0.06 g (0.00033 mol) of 1,2-dibromoethane were added thereto. The contents were heated to from 60° C. to 65° C., and 9.30 g (0.0588 mol) of 3-(dimethylamino) propyl chloride hydrochloride was dropped thereinto, followed by a reaction under reflux for 8 hours. After elimination of metal magnesium was recognized, the reaction liquid was returned to room temperature, and 73.5 ml (0.0294 mol) of a zinc chloride (6.5 mass %) ether solution was dropped thereinto. After the dropping, the reaction liquid was subjected to a reaction under heating at from 60° C. to 65° C. for 8 hours. After the reaction, the solvent was distilled away, extraction treatment was performed with dehydrated hexane (400 ml), and then a precipitate was separated by filtration through a membrane filter having a pore diameter of 0.2 μm. Thus, a while solid was obtained. The resultant while solid was distilled (in an oil bath at from 110° C. to 115° C.) under reduced pressure (from 20 Pa to 30 Pa) conditions. Thus, 7.0 g (0.0294 mol, yield: 23.3%) of a white solid was obtained as a distillate. The resultant white solid was subjected to $^1$H-NMR and ICP-AES analysis, and as a result, was identified as Zinc Compound No. 379 that was a target compound. The $^1$H-NMR and ICP-AES analysis results of the resultant white solid are shown below.

(1) $^1$H-NMR (deuterated benzene) 0.285-0.321 ppm (2H, triplet), 1.875 ppm (6H, singlet), 1.919-1.935 ppm (2H, multiplet), 1.994-2.022 ppm (2H, multiplet)

(2) ICP-AES Zinc content: 27.2 mass % (theoretical value: 27.5 mass %)

[Example 6] Synthesis of Zinc Compound No. 392

3.50 Grams (0.143 mol) of metal magnesium was loaded into a 1,000 ml four-necked flask. The flask was brought under an argon atmosphere, and then 500 ml of dehydrated tetrahydrofuran and 0.10 g (0.00053 mol) of 1,2-dibromoethane were added thereto. The contents were heated to from 60° C. to 65° C., and 20.0 g (0.136 mol) of 3-chloro-N,N-diethylpropan-1-amine was dropped thereinto, followed by a reaction under reflux for 8 hours. After elimination of metal magnesium was recognized, the reaction liquid was returned to room temperature, and 170 ml (0.0680 mol) of a zinc chloride (6.5 mass %) ether solution was dropped thereinto. After the dropping, the reaction liquid was subjected to a reaction under heating at from 60° C. to 65° C. for 8 hours. After the reaction, the solvent was distilled away, extraction treatment was performed with dehydrated hexane (500 ml), and then a precipitate was separated by filtration through a membrane filter having a pore diameter of 0.2 μm. Thus, a viscous liquid was obtained. The resultant viscous liquid was distilled (in an oil bath at from 110° C. to 115° C., top temperature: from 95° C. to 99° C.) under reduced pressure (from 20 Pa to 30 Pa) conditions. Thus, 13.0 g (0.0442 mol, yield: 65.0%) of a colorless transparent liquid was obtained as a distillate. The resultant colorless transparent liquid was subjected to $^1$H-NMR and ICP-AES analysis, and as a result, was identified as Zinc Compound No. 392 that was a target compound. The $^1$H-NMR and ICP-AES analysis results of the resultant colorless transparent liquid are shown below.

(1) $^1$H-NMR (deuterated benzene)

0.323-0.359 ppm (2H, triplet), 0.805-0.841 ppm (6H, triplet), 1.942-1.992 ppm (2H, multiplet), 2.233-2.262 ppm (2H, multiplet), 2.392-2.446 ppm (4H, quartet)

(2) ICP-AES

Zinc content: 22.8 mass % (theoretical value: 22.3 mass %)

Evaluation of Physical Properties of Compound

The following evaluations were performed on the compounds synthesized in Example 1 to Example 6, and the following Comparative Compound 1 and Comparative Compound 2.

Comparative Compound 1: trimethylindium
Comparative Compound 2: diethylzinc (1) Evaluation of Melting Point The state of each of the compounds at normal pressure and 25° C. was visually observed. A compound that was a solid at 25° C. was measured for a melting point with a micro melting point-measuring device. Those results are shown in Table 1.

(2) Temperature (° C.) at Time of 50 Mass % Loss in Reduced-pressure TG-DTA

A change in weight of each of test compounds was measured with a TG-DTA at 10 Torr, an argon flow rate of 50 mL/min, and a temperature increase rate of 10° C./min in the scanning temperature range of from 30° C. to 600° C., and a temperature (° C.) when the weight of the test compound reduced by 50 mass % was evaluated as a "temperature (° C.) at the time of a 50 mass % loss in reduced-pressure TG-DTA." A lower temperature (° C.) at the time of a 50 mass % loss in reduced-pressure TG-DTA means that vapor is obtained at a lower temperature. Those results are shown in Table 1.

(3) Temperature (° C.) at Time of 50 Mass % Loss in Normal-pressure TG-DTA

A change in weight of each of the test compounds was measured with a TG-DTA at 760 Torr, an argon flow rate of 100 mL/min, and a temperature increase rate of 10° C./min in the scanning temperature range of from 30° C. to 600° C., and a temperature (° C.) when the weight of the test compound reduced by 50 mass % was evaluated as a "temperature (° C.) at the time of a 50 mass % loss in normal-pressure TG-DTA." A lower temperature (° C.) at the time of a 50 mass % loss in normal-pressure TG-DTA means that vapor is obtained at a lower temperature. Those results are shown in Table 1.

(4) Thermal Decomposition Start Temperature (° C.)

In a DSC chart measured with a differential scanning calorimeter (DSC) at an argon flow rate of 20 mL/min and a temperature increase rate of 10° C./min in the scanning temperature range of from 30° ° C. to 500° C., an exothermic or endothermic start point was evaluated as a thermal decomposition start temperature (° C.). Those results are shown in Table 1.

Next, a thin-film was produced by using each of the compounds having been evaluated in the foregoing as a thin-film forming raw material, which was used in an atomic layer deposition method.

Example 7

A thin-film was produced on a silicon wafer serving as a substrate by using Indium Compound No. 4 as a thin-film forming raw material with the ALD apparatus illustrated in FIG. 1 under the following conditions and through the following steps. When the composition of the thin-film was analyzed by using X-ray photoelectron spectroscopy, it was recognized that the thin-film was a thin-film of indium oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 40.5 nm, and a film thickness of about 0.081 nm was obtained per cycle.

Conditions

Production method: ALD method
Reaction temperature (substrate temperature): 200° C.
Reactive gas: Water vapor Steps A series of steps formed of the following step 1 to step 4 was defined as one cycle, and the cycle was repeated 500 times.

Step 1: Vapor of the thin-film forming raw material (raw material gas) obtained by vaporization under the conditions of a raw material container temperature of 200° C. and a raw material container internal pressure of 26.67 Pa is introduced into a film formation chamber, and the raw material gas is caused to adsorb to the surface of the substrate at a system pressure of 26.67 Pa for 20 seconds, to thereby form a precursor thin-film.

Step 2: The raw material gas that has not adsorbed to the surface of the substrate is evacuated from the inside of the system through argon purging for 30 seconds.

Step 3: A reactive gas is introduced into the film formation chamber, and the precursor thin-film and the reactive gas are caused to react with each other at a system pressure of 100 Pa for 1 second.

Step 4: The reactive gas that is unreacted and a by-product gas are evacuated from the inside of the system through argon purging for 60 seconds.

Example 8

A thin-film was produced on a silicon wafer serving as a substrate in the same manner as in Example 7 except that Indium Compound No. 4 was changed to Indium Compound No. 20. When the composition of the thin-film was analyzed by using X-ray photoelectron spectroscopy, it was recognized that the thin-film was indium oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 45.6 nm, and a film thickness of about 0.0912 nm was obtained per cycle.

Example 9

A thin-film was produced on a silicon wafer serving as a substrate in the same manner as in Example 7 except that Indium Compound No. 4 was changed to Indium Compound No. 24. When the composition of the thin-film was analyzed by using X-ray photoelectron spectroscopy, it was recognized that the thin-film was indium oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 39.5 nm, and a film thickness of about 0.079 nm was obtained per cycle.

Example 10

A thin-film was produced on a silicon wafer serving as a substrate in the same manner as in Example 7 except that Indium Compound No. 4 was changed to Zinc Compound No. 333. When the composition of the thin-film was analyzed by using X-ray photoelectron spectroscopy, it was recognized that the thin-film was zinc oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 60.4 nm, and a film thickness of about 0.121 nm was obtained per cycle.

Example 11

A thin-film was produced on a silicon wafer serving as a substrate in the same manner as in Example 7 except that Indium Compound No. 4 was changed to Zinc Compound No. 379. When the composition of the thin-film was analyzed by using X-ray photoelectron spectroscopy, it was recognized that the thin-film was zinc oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 63.5 nm, and a film thickness of about 0.127 nm was obtained per cycle.

Example 12

A thin-film was produced on a silicon wafer serving as a substrate in the same manner as in Example 7 except that Indium Compound No. 4 was changed to Zinc Compound No. 392. When the composition of the thin-film was analyzed by using X-ray photoelectron spectroscopy, it was recognized that the thin-film was zinc oxide, and a residual carbon content in the thin-film was less than 0.01 atm %, which was a detection limit. In addition, when the film thickness of the thin-film was measured by using an X-ray reflectivity method, the thin-film formed on the substrate was a flat and smooth film having a film thickness of 59.1 nm, and a film thickness of about 0.118 nm was obtained per cycle.

Comparative Example 1

A thin-film was produced on a silicon wafer serving as a substrate in the same manner as in Example 7 except that Indium Compound No. 4 was changed to Comparative Compound 1 (trimethylindium). When the composition of the thin-film was analyzed by using X-ray photoelectron spectroscopy, the thin-film was a thin-film of indium oxide, but a residual carbon content in the thin-film was 20.3 atm % probably because trimethylindium had spontaneous combustibility. In addition, when the film thickness of the thin-film was measured by using an X-ray reflectivity method, the thin-film formed on the substrate was a flat and smooth film having a film thickness of 50.5 nm, and a film thickness of about 0.101 nm was obtained per cycle.

Comparative Example 2

A thin-film was produced on a silicon wafer serving as a substrate in the same manner as in Example 7 except that Indium Compound No. 4 was changed to Comparative Compound 2 (diethylzinc). When the composition of the thin-film was analyzed by using X-ray photoelectron spectroscopy, the thin-film was zinc oxide, but a residual carbon content in the thin-film was 15.8 atm % probably because diethylzinc had spontaneous combustibility. In addition, when the film thickness of the thin-film was measured by using an X-ray reflectivity method, the thin-film formed on the substrate was a flat and smooth film having a film thickness of 60.5 nm, and a film thickness of about 0.121 nm was obtained per cycle.

TABLE 1

| | Compound | State at 25° C. | Melting point (° C.) | Temperature (° C.) at time of 50 mass % loss in reduced-pressure TG-DTA | Temperature (° C.) at time of 50 mass % loss in normal-pressure TG-DTA | Thermal decomposition start temperature (° C.) | Residual carbon content |
|---|---|---|---|---|---|---|---|
| Example 7 | No. 4 | Liquid | — | 81 | 156 | 316 | Less than 0.01 atm % |
| Example 8 | No. 20 | Liquid | — | 84 | 158 | 267 | Less than 0.01 atm % |
| Example 9 | No. 24 | Liquid | — | 101 | 180 | 239 | Less than 0.01 atm % |
| Example 10 | No. 333 | Liquid | — | 76 | 149 | 278 | Less than 0.01 atm % |
| Example 11 | No. 379 | Solid | 43 | 85 | 162 | 250 to 260 | Less than 0.01 atm % |
| Example 12 | No. 392 | Liquid | — | 122 | 250 | 250 to 260 | Less than 0.01 atm % |
| Comparative Example 1 | Comparative Compound 1 | Solid | 85 | 43 | 86 | 176 | 20.3 atm % |
| Comparative Example 2 | Comparative Compound 2 | Liquid | — | Unmeasured | Unmeasured | 183 | 15.8 atm % |

It was recognized from the foregoing that, in the present invention, an indium-containing thin-film or a zinc-containing thin-film, which had a small residual carbon amount and high quality, was able to be produced by an atomic layer deposition method using an indium compound or a zinc compound having a specific structure.

The invention claimed is:

1. A method of producing a thin-film containing a zinc atom on a surface of a substrate by an atomic layer deposition method, the method comprising:

causing a raw material gas, which is obtained by vaporizing a thin-film forming raw material to adsorb to the surface of the substrate, to thereby form a precursor thin-film, wherein the thin-film forming raw material comprises a compound represented by the following general formula (1):

$$M(R^1)_{x1}[A^1\text{-}N(R^2)(R^3)]_y (1)$$

in the formula (1), $R^1$, $R^2$, and $R^3$ each independently represent a linear or branched alkyl group having 1 to 4 carbon atoms, $A^1$ represents a linear or branched alkylene group having 1 to 5 carbon atoms, x1 represents an integer of from 0 to 2, y1 represents an integer of from 1 to 3, and M represents a zinc atom;

evacuating the raw material gas remaining unreacted; and causing the precursor thin-film to react with a reactive gas, to thereby form the thin-film containing a zinc atom on the surface of the substrate.

2. The method of producing the thin-film according to claim 1, wherein the reactive gas is an oxidizing gas, and wherein the thin-film containing the zinc atom is zinc oxide.

3. The method of producing the thin-film according to claim 2, wherein the oxidizing gas is a gas containing at least one selected from the group consisting of: water vapor; oxygen; and ozone.

* * * * *